(12) United States Patent
Cioaca

(10) Patent No.: US 7,240,147 B2
(45) Date of Patent: *Jul. 3, 2007

(54) MEMORY DECODER AND DATA BUS FOR BURST PAGE READ

(75) Inventor: Dumitru Cioaca, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/416,583

(22) Filed: May 3, 2006

(65) Prior Publication Data

US 2006/0198212 A1    Sep. 7, 2006

Related U.S. Application Data

(63) Continuation of application No. 10/411,422, filed on Apr. 10, 2003, now Pat. No. 7,093,062.

(51) Int. Cl.
G06F 12/06 (2006.01)
G06F 12/00 (2006.01)
G11C 16/06 (2006.01)

(52) U.S. Cl. ........................ 711/103; 711/102; 711/2; 365/185.21; 365/189.05; 365/230.08

(58) Field of Classification Search ............ None
See application file for complete search history.

(56) References Cited

U.S. PATENT DOCUMENTS 3,898,627 A * 8/1975 Hooker et al. ........... 358/1.11
4,000,486 A * 12/1976 Schomburg ............... 358/1.17
5,809,038 A    9/1998 Martin
5,959,921 A    9/1999 Manning et al.
6,009,501 A   12/1999 Manning
6,111,815 A    8/2000 Takeda
6,295,618 B1   9/2001 Keeth
6,356,474 B1   3/2002 Bissey et al.
2001/0014031 A1* 8/2001 Tanaka ..................... 365/110

* cited by examiner

*Primary Examiner*—Kevin L. Ellis
*Assistant Examiner*—Mardochee Chery
(74) *Attorney, Agent, or Firm*—Leffert Jay & Polglaze, PA

(57) ABSTRACT

Memory device is described that utilizes a reduced number of sense amplifiers to sense the data bits of a selected column page. The sense amplifiers are multiplexed and the read data values latched, allowing the sense amplifiers to sense the next set of data lines from the selected column page before the currently latched values have been read out. A specialized decoder and a latch control circuit allows there to be no gaps or latencies while reading data from the memory due to reloading the read latches or in multiplexing the sense amplifiers. The design allows there to be no gaps or latencies while reading data from the memory due to reloading the read latches or multiplexing the sense amplifiers to sense a following set of data bit lines.

30 Claims, 21 Drawing Sheets

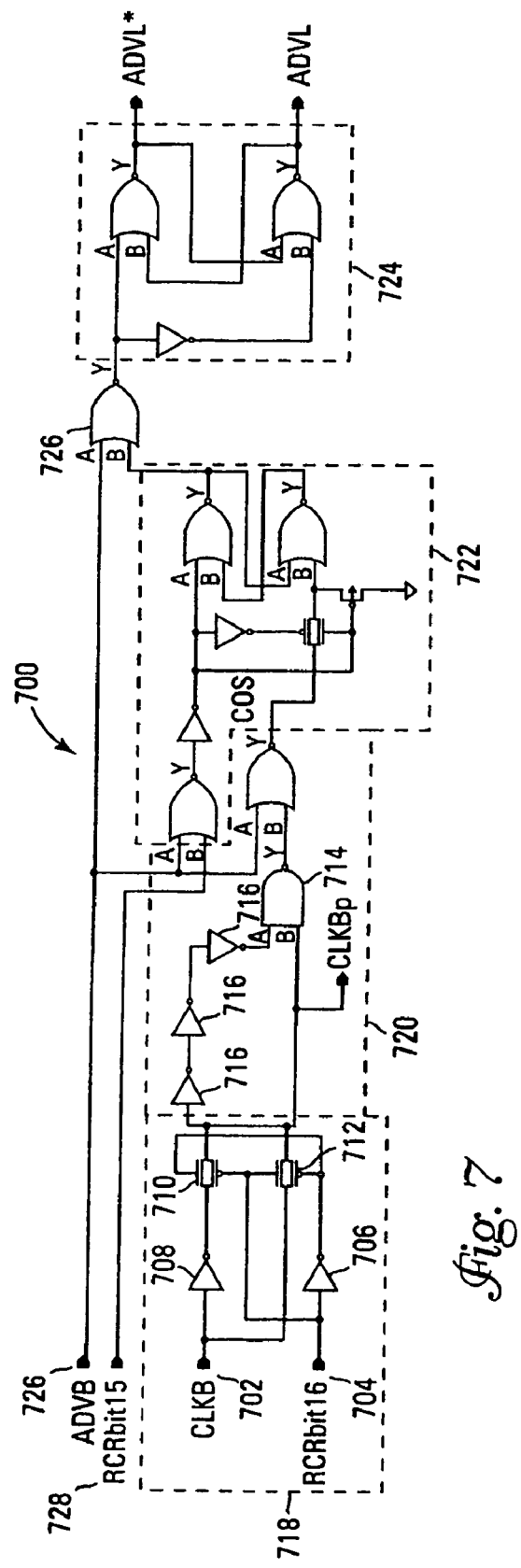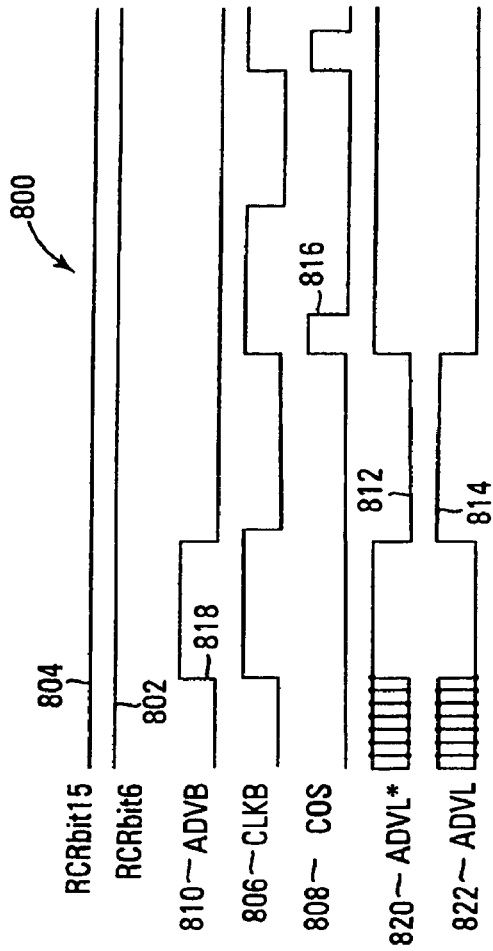
Fig. 7
Fig. 8

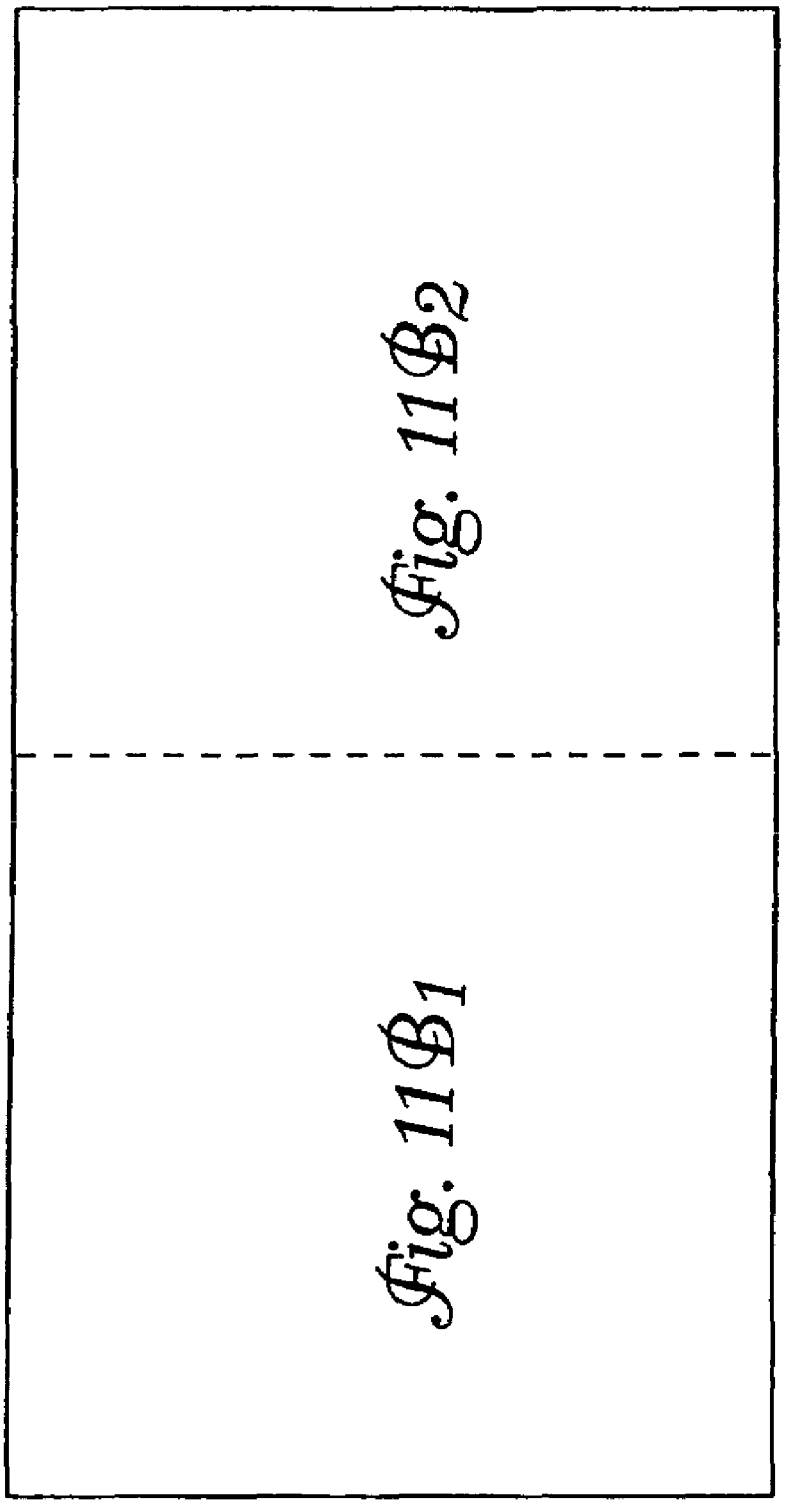

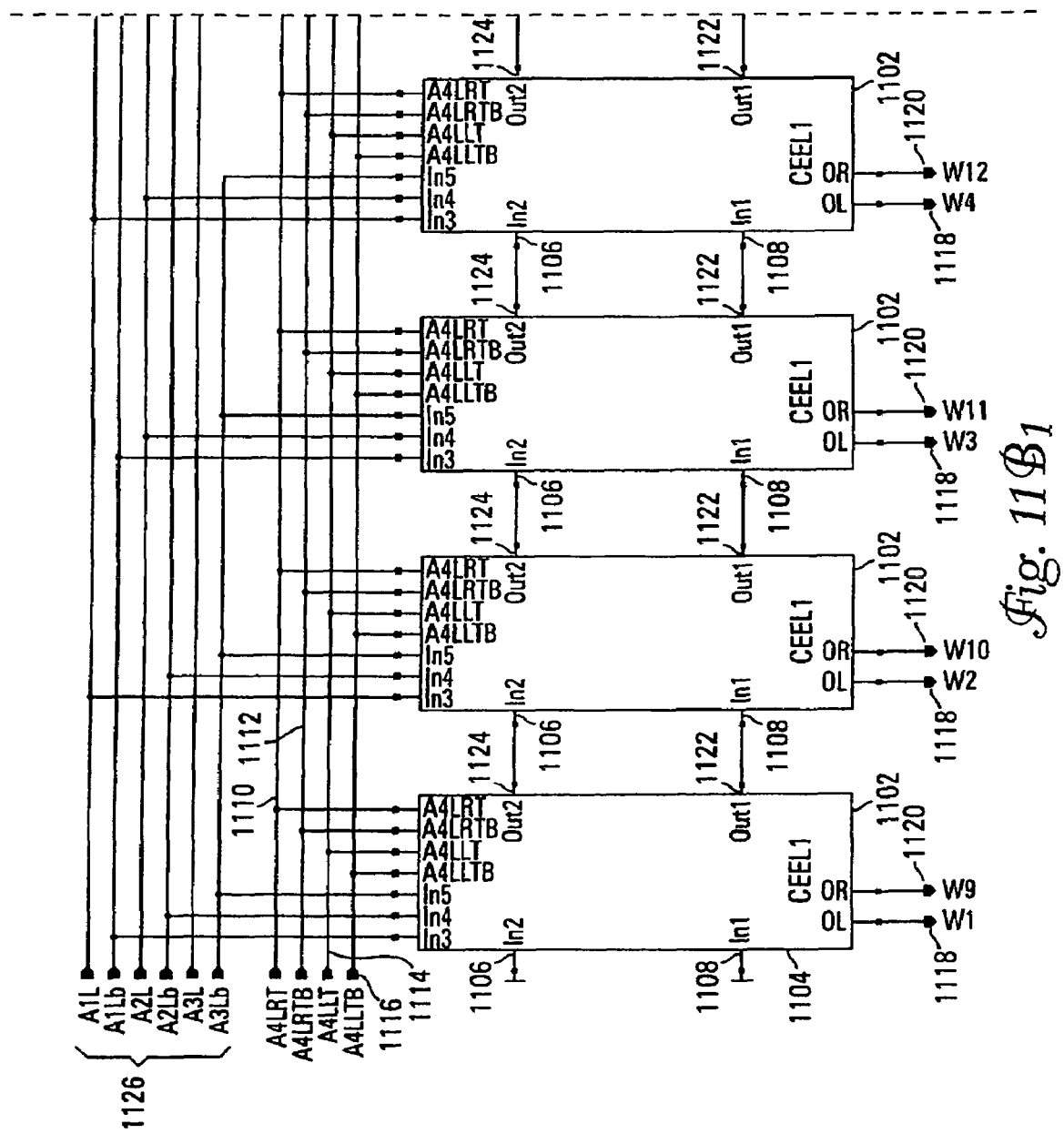
Fig. 11B₁

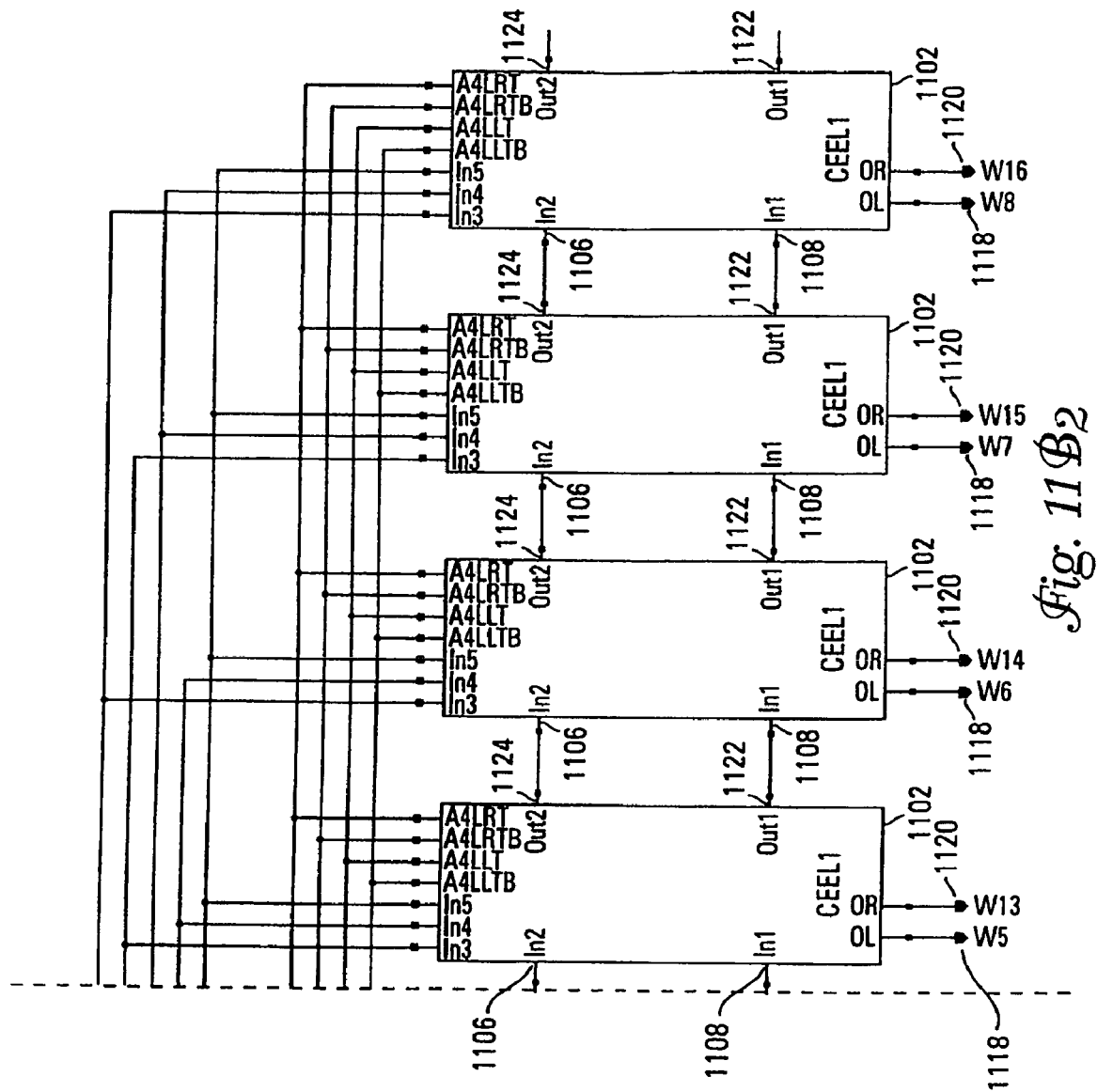
Fig. 11B2

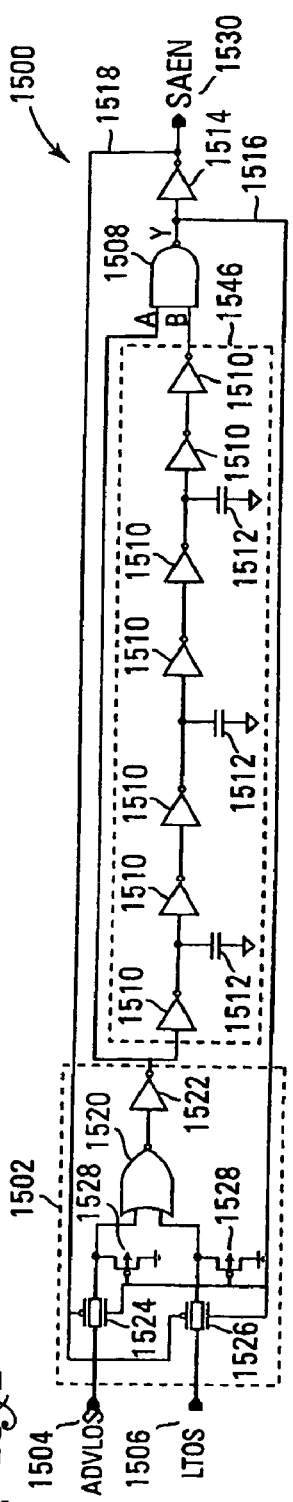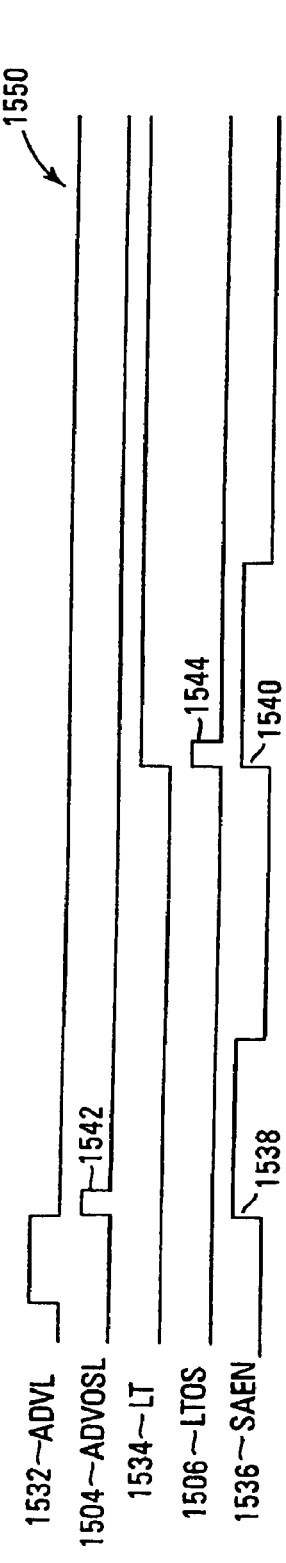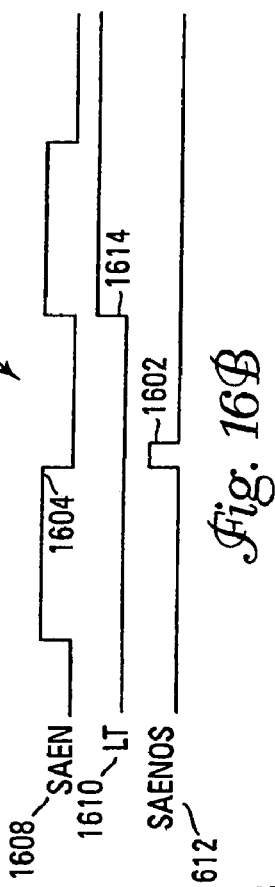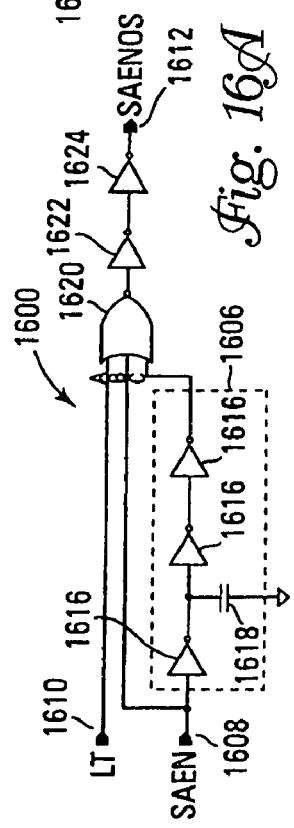

US 7,240,147 B2

MEMORY DECODER AND DATA BUS FOR BURST PAGE READ

RELATED APPLICATIONS

This is a continuation application of U.S. patent application Ser. No. 10/411,422, filed Apr. 10, 2003 now U.S. Pat. No. 7,093,062 (allowed) titled FLASH MEMORY DATA BUS FOR SYNCRONOUS BURST READ PAGE, which is commonly assigned to the assignee of the present invention and the entire contents of which are incorporated herein by reference.

TECHNICAL FIELD OF THE INVENTION

The present invention relates generally to memory devices and in particular the present invention relates to Flash memory devices with synchronous burst read modes.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively.

Yet another type of non-volatile memory is a Flash memory. A Flash memory is a type of EEPROM that can be erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks." Each of the cells within an erase block can be electrically programmed in a random basis by charging the floating gate. The charge can be removed from the floating gate by a block erase operation, wherein all floating gate memory cells in the erase block are erased in a single operation.

Both RAM and ROM random access memory devices have memory cells that are typically arranged in an array of rows and columns. During operation, a row (page) is accessed and then memory cells can be randomly accessed on the page by providing column addresses. This access mode is referred to as page mode access. To read or write to multiple column locations on a page requires the external application of multiple column addresses. To increase access time, a burst mode access has been implemented. The burst mode uses an internal column address counter circuit to generate additional column addresses. The address counter begins at an externally provided address and advances in response to an external clock signal or a column address strobe signal.

Two common types of Flash memory array architectures are the "NAND" and "NOR" architectures, so called for the logical form in which the basic memory cell configuration arranged in each. In the NOR array architecture, the floating gate memory cells of the memory array are arranged in a matrix. The gates of each floating gate memory cell of the array matrix are coupled by rows to word select lines (word lines) and their drains are coupled to column bit lines. The source of each floating gate memory cell is typically coupled to a common source line. The NOR architecture floating gate memory array is accessed by a row decoder activating a row of floating gate memory cells by selecting the word line coupled to their gates. The row of selected memory cells then place their stored data values on the column bit lines by flowing a differing current if in a programmed state or not programmed state from the coupled source line to the coupled column bit lines.

A NAND array architecture also arranges its array of floating gate memory cells in a matrix such that the gates of each floating gate memory cell of the array are coupled by rows to word lines. However each memory cell is not directly coupled to a source line and a column bit line. Instead, the memory cells of the array are arranged together in strings, typically of 8 to 16 each, where the memory cells in the string are coupled together in series, source to drain, between a common source line and a column bit line. The NAND architecture floating gate memory array is then accessed by a row decoder activating a row of floating gate memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate memory cell of the series coupled string, restricted only by the memory cells of each string that are selected to be read. Thereby placing the current encoded stored data values of the row of selected memory cells on the column bit lines.

A synchronous DRAM (SDRAM) is a type of DRAM that can run at much higher clock speeds than conventional DRAM memory. SDRAM synchronizes itself with a CPU's bus and is capable of running at 100 MHZ or 133 MHZ, about three times faster than conventional FPM (Fast Page Mode) RAM, and about twice as fast EDO (Extended Data Output) DRAM and BEDO (Burst Extended Data Output) DRAM. An extended form of SDRAM that can transfer a data value on the rising and falling edge of the clock signal is called double data rate SDRAM (DDR SDRAM, or simply, DDR). SDRAM's can be accessed quickly, but are volatile. Many computer systems are designed to operate using SDRAM, but would benefit from non-volatile memory. A synchronous Flash memory has been designed that allows for a non-volatile memory device with an SDRAM interface. Although knowledge of the function and internal structure of a synchronous Flash memory is not essential to understanding the present invention, a detailed discussion is included in U.S. patent application Ser. No. 09/627,682 filed Jul. 28, 2000 and titled, "Synchronous Flash Memory."

Memory devices generally have a minimum read latency time that a requesting device must wait after sending the memory device the row and column address before the data is available to be read. This minimum latency is typically due to the time required by the sense amplifiers to read the data values from the memory array that has been selected by the row and column address decoders. Additionally, other delay components are also incorporated in the minimum read latency. These are typically due to such items as the delay of the column address decoding and coupling the sensed data to the external data lines through the data buffer. As these other delay components are typically small, it is common practice to equate the minimum read latency to the minimum sensing time of the sense amplifiers of the memory device.

To minimize read latency for burst accesses and/or subsequent read requests, which will often occur within the same selected row or column "page", memory devices will typically sense all the data bits of a selected column page at once. This is generally accomplished by incorporating a large number of sense amplifiers into the memory device, allowing all the data bits of the selected column page to be read in parallel. Because of the large number of sense amplifiers, a large data bus is usually also incorporated to couple the sense amplifiers to the memory array and to the internal data buffer of the memory device. The large number of sense amplifiers and large internal data bus to pre-read the other data words of the column page are particularly important for the operation of memory devices capable of burst mode access, where sequentially addressed data words are read from the memory device on each following clock cycle after the initial request and the read latency delay.

The large number of sense amplifiers and their coupled internal memory bus can significantly increase the circuit space requirements of the memory device on the integrated circuit substrate that it is manufactured on. Generally, the larger the space required for an integrated circuit design the fewer the number of copies of the design can be placed on a substrate wafer as it is processed and later "diced" into individual "dies," each die having a single circuit copy on it. This lowers the typical device yield of a substrate wafer, defined as the number of unflawed devices produced from a substrate wafer, by increasing the probability of a given device containing a flaw due to the larger die size. The reduced number of dies that are yielded from a substrate wafer and the increased odds of any single die containing a flaw have the effect of increasing the production cost of the resulting memory device.

Additionally, the increased number of simultaneously active sense amplifiers in an individual memory device also increases the amount of power consumption of the device by increasing the amount of current required while it is engaged in a read operation. The increased current consumption of the memory device increases the inherent level of electronic noise that is seen internal to the memory device and externally in the circuitry that surround it, increasing the probability of a noise induced read or logic error. The noise levels of a memory device often require the designer to utilize higher voltages to operate the circuit and mitigate the possibility of such an error, further increasing device power consumption and possible device feature sizes.

For the reasons stated above, and for other reasons stated below which will become apparent to those skilled in the art upon reading and understanding the present specification, there is a need in the art for alternative circuits and methods of reading memory arrays that minimize the number of sense amplifiers and the size of the internal data bus.

BRIEF DESCRIPTION OF THE DRAWINGS

FIG. 7 is a diagram of an address latch generator of a memory in accordance with an embodiment of the present invention.

FIG. 8 is a waveform diagram detailing the signals of an address latch generator of an embodiment of the present invention.

FIGS. 11A and 11B are diagrams of a domino decoder of a memory in accordance with an embodiment of the present invention.

FIGS. 15A and 15B are diagrams of a sense amplifier enable circuit and its signal waveforms of a memory in accordance with an embodiment of the present invention.

FIGS. 16A and 16B are diagrams of a sense amplifier enable one shot circuit and its signal waveforms of a memory in accordance with an embodiment of the present invention.

DETAILED DESCRIPTION

Figure 1:
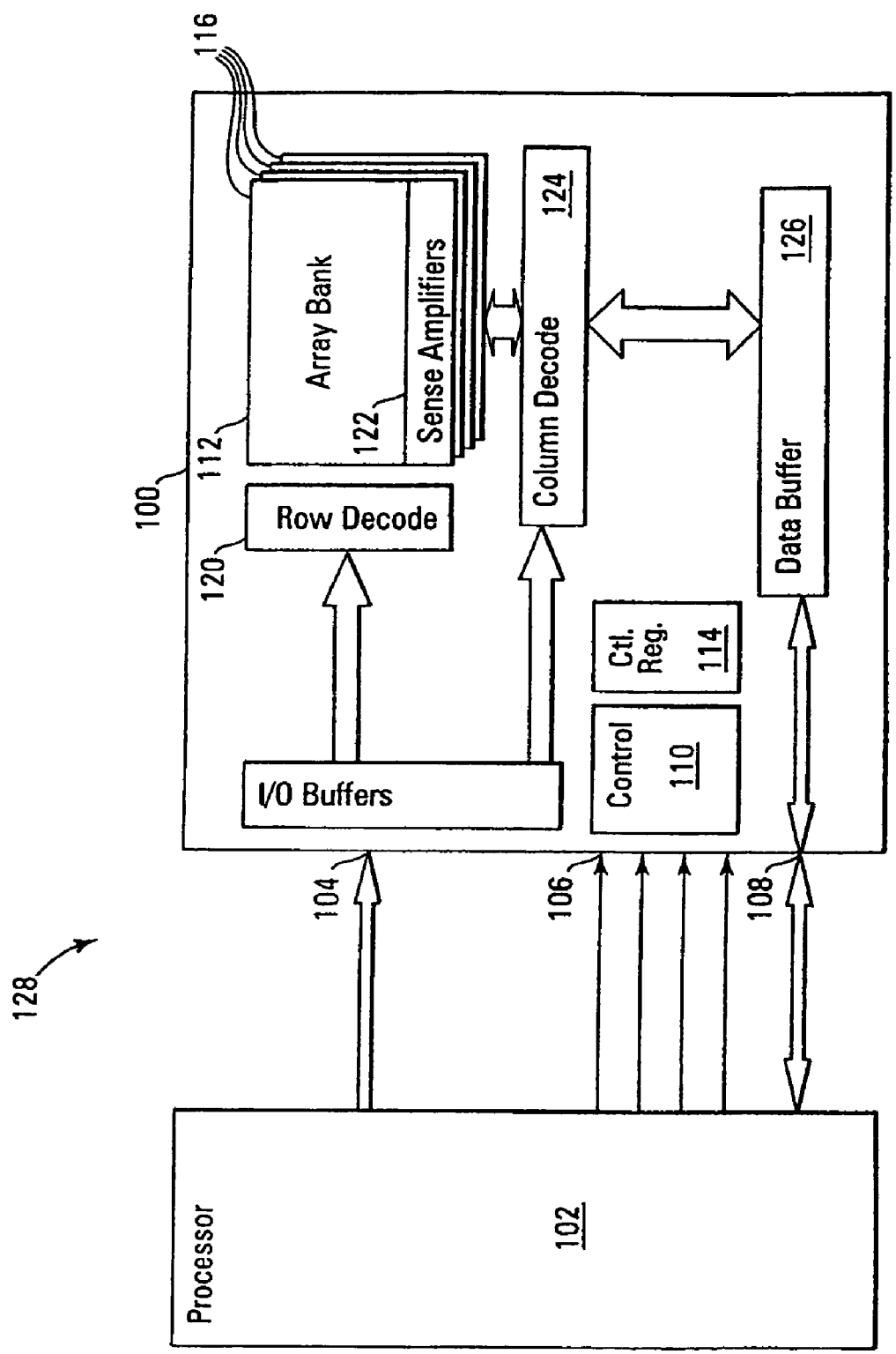
FIG. 1 is a simplified block diagram of a system containing a Flash memory device.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

The various embodiments relate to memory devices that reduce the number of sense amplifiers and internal data bus required for read operations while enabling burst mode operation. Memory device embodiments of the present invention utilize a reduced number of sense amplifiers to sense the data bits of the selected column page. This is accomplished by multiplexing the sense amplifiers and latching the results to allow the sense amplifiers to sense the next set of data lines from the selected column page. The reduced number of sense amplifiers allows for a smaller internal data bus to be utilized, saving additional circuit space and routing resources. The number of sense amplifiers are chosen such that the resulting number of data words they read are equal to or greater than the greatest number of data words that can be read from the memory device in the time of the minimum read latency time/sensing cycle time of the sense amplifiers. This allows the memory to be able to sense the next set of data bit lines and assemble the data words before they are required to be available for reading out of the memory device. A specialized decoder, called a domino decoder, and a control circuit are utilized to select a set of data bit lines to be sensed and control the data latches. This allows there to be no gaps or latencies while reading data from the memory due to reloading the read latches or in multiplexing the sense amplifiers to sense a following set of data bit lines in the selected column page. Additionally, this allows a burst read starting point to be selected at random from the selected column page.

Conventional memory devices typically have large word decode groups to keep up with sequential memory accesses or burst data transfers, thus each request initiates a large number of data words being decoded and sensed at once. This requires a large number of sense amplifiers (256 or more are commonly used) and a correspondingly large internal data bus to read and transfer the selected word decode group to the data I/O buffer in parallel. Memory devices incorporating embodiments of the present invention utilize a reduced number of sense amplifiers to sense the data bits of the selected column page. This is accomplished by multiplexing the sense amplifiers and latching the results to allow the sense amplifiers to sense the next set of data lines from the selected column page. The reduced number of sense amplifiers allows for a smaller internal data bus to be utilized, saving additional circuit space and routing resources.

The number of sense amplifiers are chosen such that the resulting number of data words they read are equal to or greater than the greatest number of data words that can be read from the memory device in the time of the minimum read latency time/sensing cycle time of the sense amplifiers. This allows the memory to be able to sense the next set of data bit lines and assemble the data words before they are required to be available for reading out of the memory device. A specialized decoder, called a domino decoder, and control circuitry is utilized to select a set of data bit lines to be sensed and control the data latches. These circuits allow there to be no gaps or latencies while reading data from the memory due to reloading the read latches or in multiplexing the sense amplifiers to sense a following set of data bit lines in the selected column page. Additionally, this allows burst reads starting from a point selected at random from the selected column page.

FIG. 1 shows a simplified diagram of a system 128 incorporating a memory device of the present invention 100 coupled to a host 102, which is typically a processing device, a processor, or a memory controller. The memory device 100 is a Flash memory has an address interface 104, a control interface 106, and a data interface 108 that are each coupled to the processing device 102 to allow memory read and write accesses. Internal to the Flash memory device a control state machine 110 directs the internal operation; managing the Flash memory array 112 and updating RAM control registers and non-volatile erase block management registers 114. The RAM control registers and tables 114 are utilized by the control state machine 110 during operation of the Flash memory 100. The Flash memory array 112 contains a sequence of memory banks or segments 116. Each bank 116 is organized logically into a series of erase blocks (not shown). Memory access addresses are received on the address interface 104 of the Flash memory 100 and divided into a row and column address portions. On a read access the row address is latched and decoded by row decode circuit 120, which selects and activates a row page (not shown) of memory cells across a selected memory bank. The bit values encoded in the output of the selected row of memory cells are coupled from a local bitline (not shown) to a global bitline (not shown) and detected by sense amplifiers 122 associated with the memory bank. The column address of the access is latched and decoded by the column decode circuit 124. The output of the column decode circuit selects the desired column data from the internal data bus (not shown) that is coupled to the outputs of the individual read sense amplifiers 122 and couples them to the data buffer 126 for transfer from the memory device through the data interface 108. On a write access the row decode circuit 120 selects the row page and column decode circuit selects write sense amplifiers 122. Data values to be written are coupled from the data buffer 126 via the internal data bus to the write sense amplifiers 122 selected by the column decode circuit 124 and written to the selected floating gate memory cells (not shown) of the memory array 112. The written cells are then reselected by the row and column decode circuits 120, 124 and sense amplifiers 122 so that they can be read to verify that the correct values have been programmed into the selected memory cells.

Figure 2:
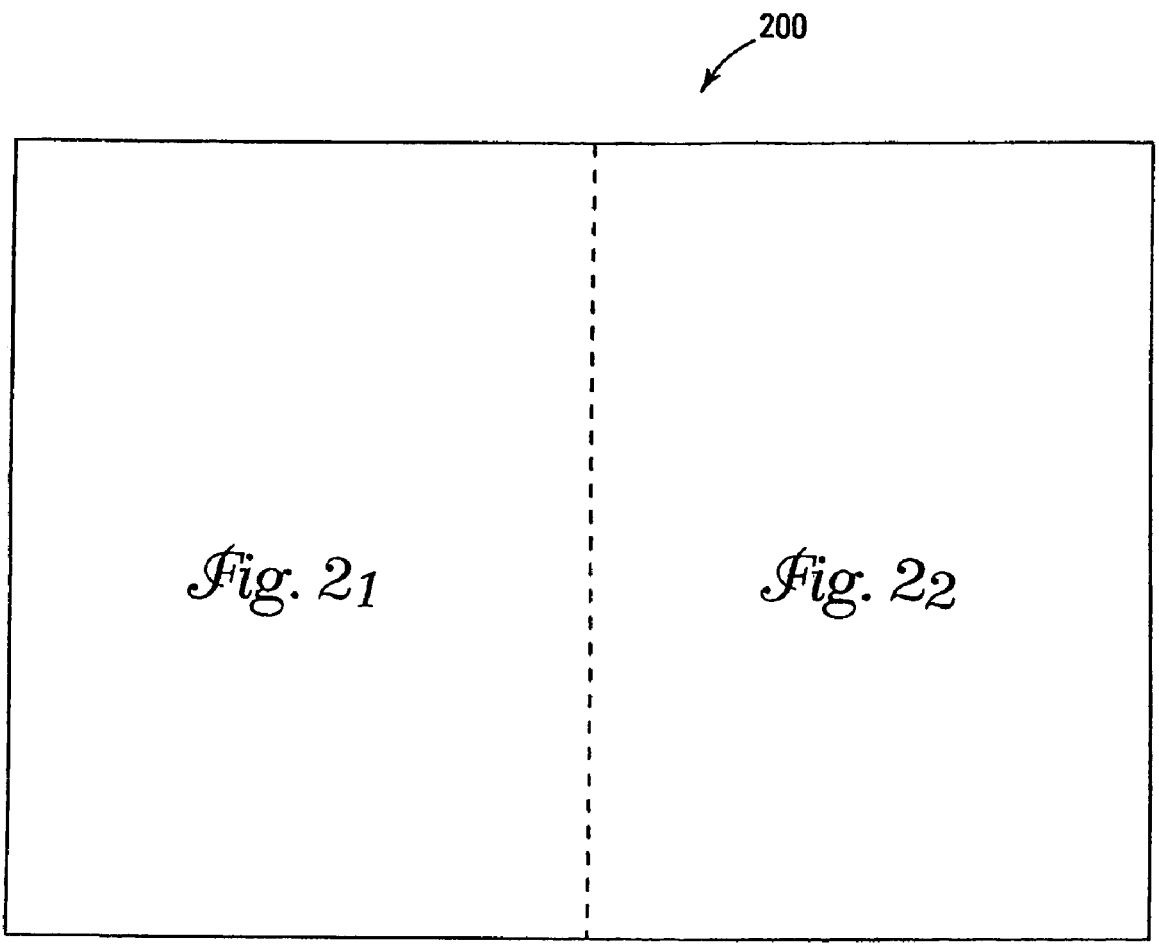
FIG. 2 is a simplified block diagram of an output stage of a memory device of the prior art.
Figure 21:
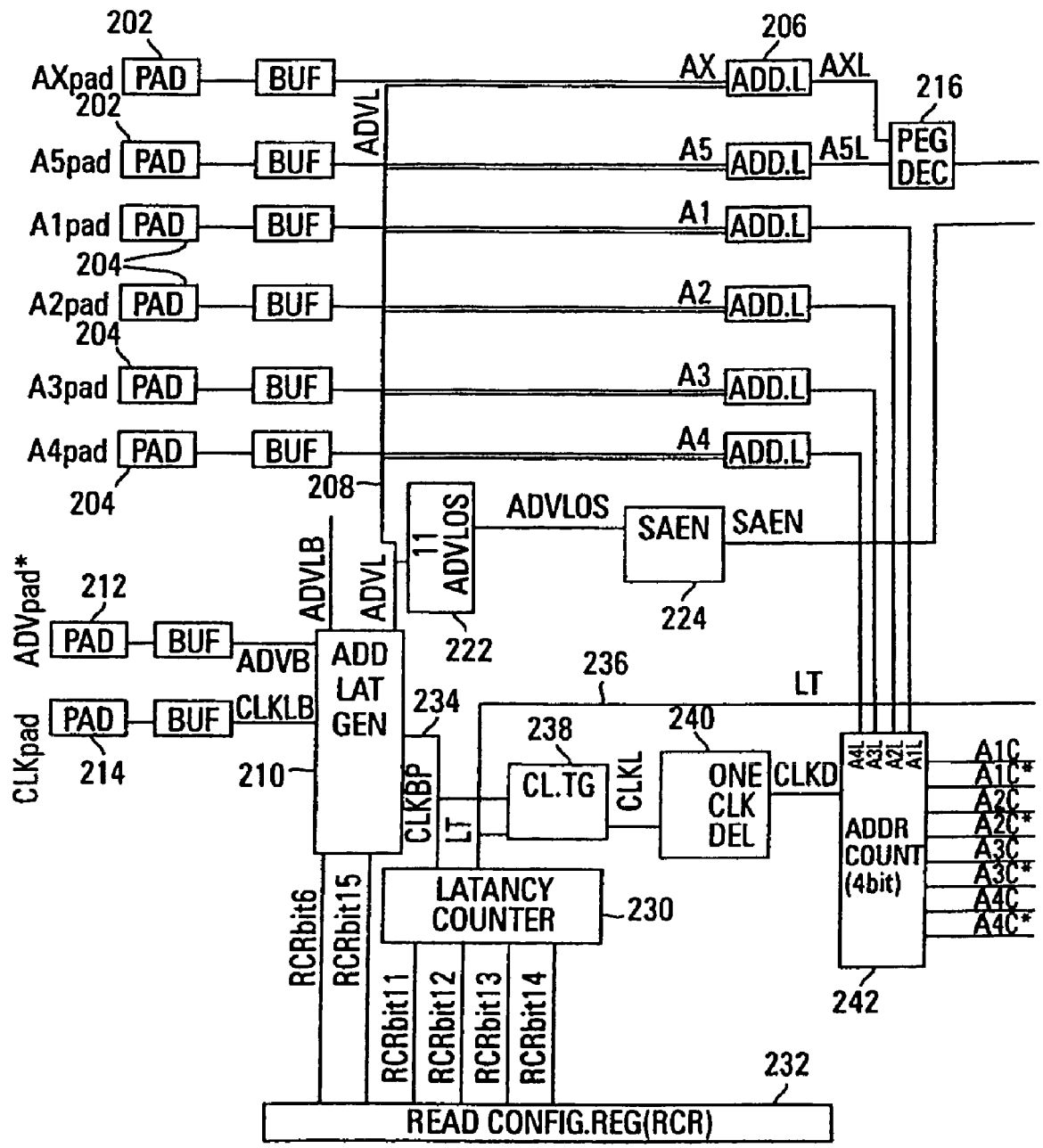
Figure 22:
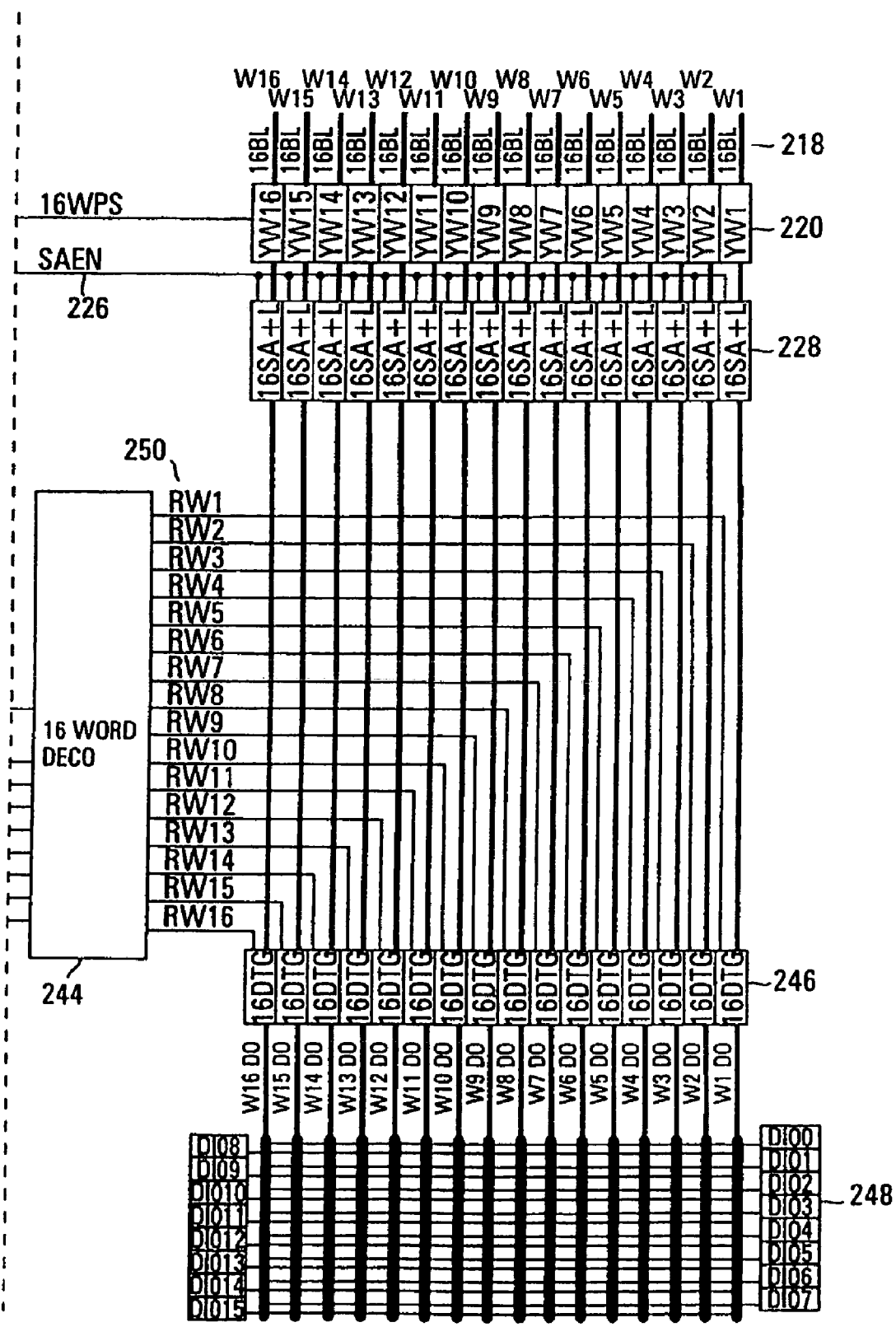

FIG. 2 shows a simplified block diagram of a Flash memory 200 of the prior art detailing the read output stage. In FIG. 2, an address request is received by the Flash memory device 200 on the address input pads 202, 204 and is buffered. The address request is latched into the address latches 206 by the address valid latch signal 208, which is generated by the address latch generator circuit 210 from the address valid input signal 212 and clock signal input 214. The address is decoded by the row decoder (not shown) and activates a row of floating gate memory cells of the memory array (not shown), which put their data values on the column bit lines 218. The column page decoder 216 selects 16 data words of 16 bits each from the bit lines 218 with the Y-pass gates 220 and couples them to 256 sense amplifiers 228 grouped in data word groups of 16 each. There are typically a large number of sense amplifiers 228 (generally>=256 in each bank) such that each selected bitline is associated with an individual sense amplifier 228. The sense amplifiers 228 are enabled to begin sensing by the sense amplifier enable signal 226 which is generated by the sense amplifier enable circuit 224. The sense amplifier enable circuit 224 is in turn triggered by the address valid one shot circuit 222 that is coupled to the address valid signal line 208.

A latency counter 230 is utilized to delay access to the data value outputs of the sense amplifiers 228 until the minimum read delay/sensing cycle time has passed and the data values are available at the sense amplifier 228 outputs. The latency counter 230 is loaded with an initial value from the read configure register (RCR) 232 and is clocked by an internal clock signal 234 generated by address latch generator circuit 210 from the clock signal input 214. When the configured latency time has passed, the latency counter 230 outputs a latency timeout signal 236, which activates the clock transmission gate 238 and couples the internal clock signal 234 to a 4-bit address counter 242 through a one clock delay 240. The 4-bit address counter 242 is loaded with an initial value/address from the lowest 4 address inputs 204, coupled from the address latches 206. The address value contained in the 4-bit address counter 242 is coupled to a 16 data word decoder 244. The 16 data word decoder 244 is also coupled to and activated by the latency counter 230 via latency timeout signal line 236. When the latency counter 230 expires, the 16 data word decoder utilizes the address outputs of the 4-bit address counter 242 to activate one of 16 read word select signals (RW1–RW16) 250. The activated read word select signal 250 selects the outputs of one group of 16 sense amplifiers via the data word transmission gates 246 and places one of the 16-bit data words on the input/output data buffers (I/O buffers) 248 to be read from the Flash memory device 200.

After expiration of the latency timer and the starting of data transfer from the Flash memory device 200, the next clock signal pulse (or next clock pulse transition/edge if a dual data rate memory) arriving at the clock input 214 increments the 4-bit address counter 242 and its current address value, advancing it to the next sequential address. This causes the coupled 16 data word decoder 244 to select the next sequential data word from the sense amplifier outputs of the selected column page and couple them to the input/output data buffers 248 to be read from the Flash memory device 200. Data words continue to be read in this fashion on every successive clock pulse until the burst read access is ended or the final data word (data word 16) of the selected column page is read (the address counter reaches 16). When the final data word of a selected column page is read and the burst access is continued the next column and/or row page must be selected from the memory array and/or bitlines. This changing of the column and/or row page introduces a delay, while memory cells are accessed and the minimum latency time has again passed for the sense amplifiers to read the new column page, until the access is allowed to continue.

Figure 3:
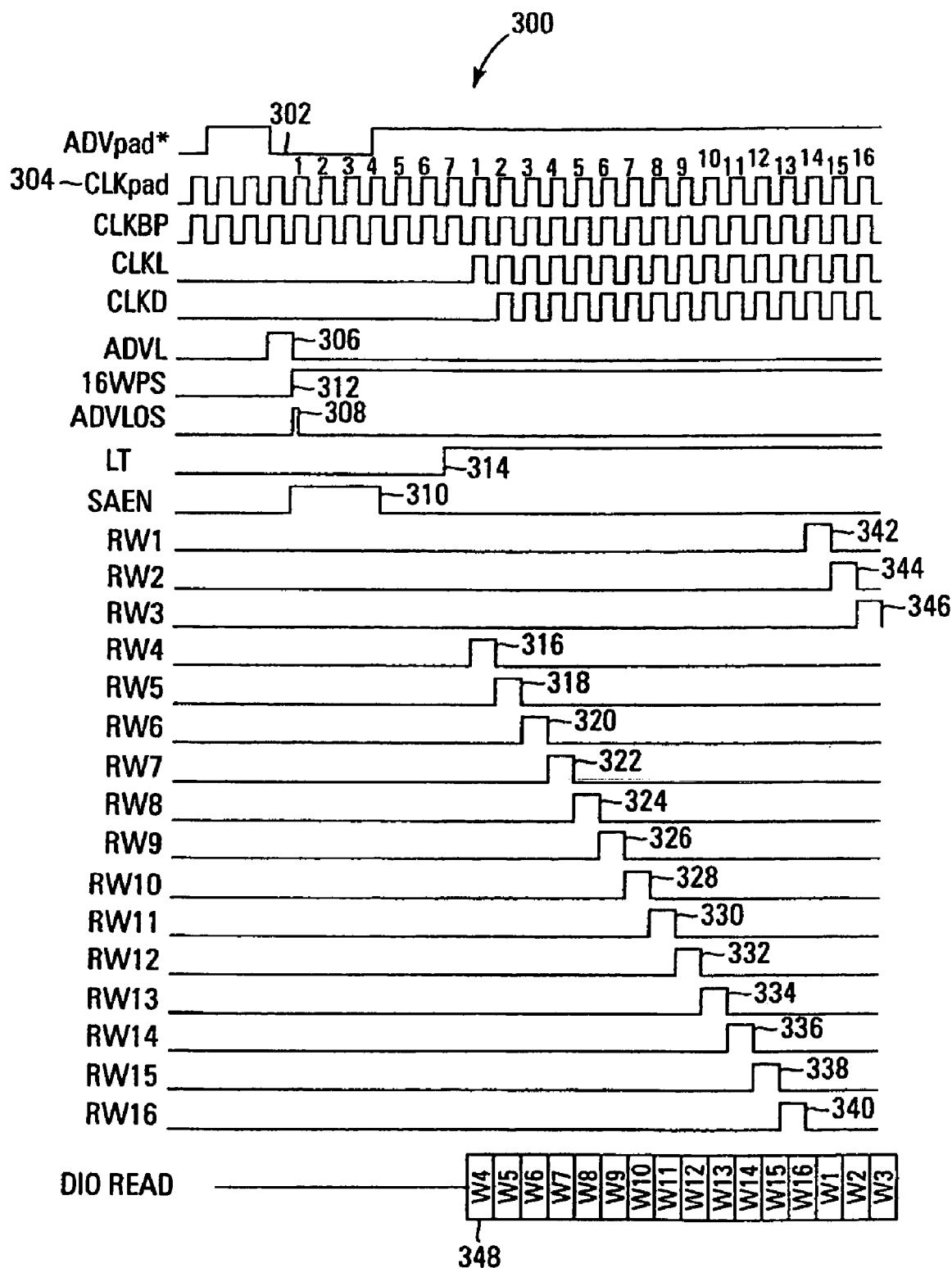
FIG. 3 is a waveform diagram detailing a burst mode operation of a memory device of the prior art.

FIG. 3 shows a waveform diagram 300 of a 16 data word burst read operation with the Flash memory 200 of the prior art detailed in FIG. 2. In the waveform diagram 300, a burst access data request is received at the memory device 200 that accesses a selected memory row and page. The memory burst begins at data word 4 of the selected 16 data word column page and wraps around in the current column page or continues of the following column page until data word 3. In FIG. 3, the data read request is received at the memory device on the address inputs (not shown) and is latched in by a signal on the active low address valid input (ADVpad*) 302. The active signal on the address valid input 302 in turn generates the address valid latch (ADVL) 306 and the address valid latch one shot (ADVLOS) 308 signals. The generation of the ADVL 306 signal latches in the address input values into the address latches 206 and generates row and column select signals (not shown) and the 16 data word page select (16WPS) signal 312 from the page decoder circuit 216, selecting the memory cells and coupling their bitlines 218 to the inputs of the sense amplifiers 228. The generation of the ADVLOS 308 signal also generates the sense amplifier enable signal 310 from the sense amplifier enable circuit 224, causing the sense amplifiers 228 to begin sensing the data values that have been coupled to them. At the expiration of the latency counter 230, after 7 clock periods 304, the latency timeout (LT) signal 314 becomes active. The active latency timeout signal 314 activates the 4-bit address counter 242 and enables the 16 word decoder 244. The 4-bit address counter 242 has been loaded with an initial starting data word value from the lowest four address values from the address latches 206 for data word 4 of the selected column page and causes the 16 word decoder 244 to output read word select 4 (RW4) 316 which couples the output of sense amplifiers 228 for data word 4 to the data input/output buffer 248 and the data word 4 is read 348 from the memory device 200.

As subsequent clock pulses are received on the clock signal input (CLKpad) 304, the 4-bit address counter 242 is advanced to the next data word address and causes the 16 word decoder 244 to output the next subsequent read word select. Thus, the 4-bit address counter 242, for a 16 data word burst will transition on each subsequent clock cycle 304 from the initial data word address of 4 to 16 and then roll over to begin counting from 1 until 3 is reached. In response to its input from the 4-bit address counter 242, the 16 word decoder 244 selects in turn RW4 316, RW5 318, RW6 320, RW7 322, RW8 324, RW9 326, RW10 328, RW11 330, RW12 332, RW13 334, RW14 336, RW15 338, RW16 340, RW1 342, RW2 344, and RW3 346 causing their associated data values to be sequentially output 348 from the memory device 200 in a burst read operation on sequential clock cycles 304. In the situation where the burst access continues in the following column page to read data words 1–3, instead of wrapping around in the current column page to read data words 1–3, a gap in the data transfer or "wait state" would be inserted between the reading of data word 16 and data word 1 of the following column page to allow once again for the passage of the minimum latency time.

It is noted that the initial data word access in the above example started at data word 4 of the selected column page and that other starting data word accesses and burst sizes are possible and will operate in a substantially similar manner. It is also noted that burst read operations with other types of memory devices are similar and would be apparent to those skilled in the art.

As stated above, embodiments of the present invention utilize a reduced number of sense amplifiers to sense the data bits of the selected column page. This is accomplished by selecting a smaller initial word group to be sensed by the reduced set of sense amplifiers from the selected column page bitlines, latching the results of the current "sensing cycle" from the sense amplifiers, and multiplexing the sense amplifiers to the next un-sensed set of bitlines. This procedure allows the sense amplifiers to sense the next set of un-sensed bitlines/data words so that they are available before the current set of latched data words are read from the memory device. The smaller data word decode group allows for a smaller number of data words to be decoded and sensed in a single "sensing cycle". The smaller data word decode group in turn allows for a smaller data bus and fewer sense amplifiers in the resulting memory. The reduction in the internal data bus and number of sense amplifiers allows for embodiments of the present invention to reduce the overall memory device circuit space/die size. Additionally, embodiments of the present invention reduce the current, noise, and power usage of the memory device through a reduction in the number of active sense amplifiers during a read operation.

The reduction in the number of sense amplifiers in memory device embodiments of the present invention can be up to 50%–75%, dependent on the speed of the memory and the minimum latency requirement/sensing cycle time of the underlying memory technology. In embodiments of the present invention, the minimum number of sense amplifiers and/or address bus lines required for a given memory device are typically related as greater than or equal to the number of bits in the burst divided by the time required to clock all data words of the burst out of the memory divided by the sense cycle time {Sense Amp divider=(number of data words in burst*clock period)/minimum read latency, Minimum sense amps and bus lines=bits in burst/((number of data words in burst*clock period)/minimum read latency)}. To hold previously sensed data words while a multiplexer circuit is utilized to direct the reduced number of sense amplifiers to new bitlines and the next group of data words are read, embodiments of the present invention utilize intermediate data latches. A specialized intermediate data latch control circuit is utilized to avoid latency and/or gaps in transitioning from one set of sensed and latched data words to the next sequential set of data words that have just been sensed.

Figure 4:
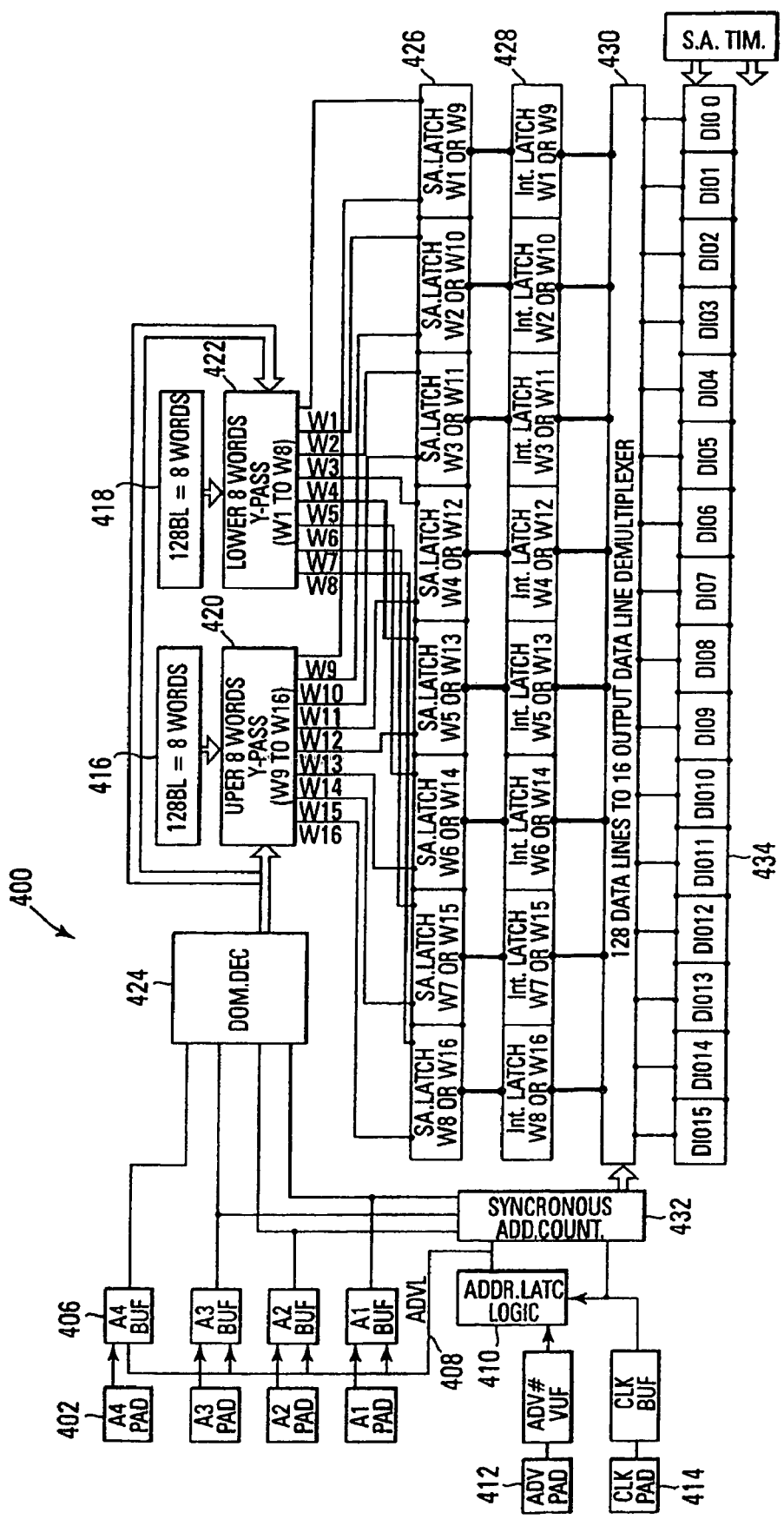
FIG. 4 is a simplified block diagram of an output stage of a memory device in accordance with an embodiment of the present invention.

FIG. 4 shows a simplified block diagram of a memory device 400 of an embodiment of the present invention detailing the output stages. The memory device 400 has a 256 bitline column page and has a minimum latency/sense amplifier cycle time such that it allows the sense amplifiers of the memory device 400 to be reduced by at least half, from 256 to 128 sense amplifiers. This reduction in sense amplifiers allows the internal bus sizes to be reduced from 256 bits to 128 bits and allows the read current, noise, and power levels due to the sense amplifiers and internal data bus to also be reduced.

In FIG. 4, an address request is received by the memory device 400 on the address input pads 402 (only address inputs A4–A1 shown) and are buffered. The address request is latched into the address latches 406 by the address valid latch signal 408, which is generated by the address latch logic 410 from the address valid input signal 412 and clock signal input 414. The address is decoded by the row decoder (not shown) and activates a row of floating gate memory cells of the memory array (not shown), which put their data values on the column bit lines (not shown). The column page decoder (not shown) selects 16 data words of 16 bits each (for a total of 256 bits) from the 256 selected bit lines. The 256 selected bit lines are divided by the memory device 400 into two groups of 128 bit lines (8 data words) each 416, 418. Each of the two groups of 128 bitlines/8 data words 416, 418 are coupled to two Y-pass multiplexers 420, 422. The first Y-pass multiplexer 422 controls the bitlines 418 for data words 1–8 of the selected 16 data word page and the second Y-pass multiplexer 420 controls the bitlines 416 for data words 9–16 of the selected 16 data word page. The Y-pass multiplexers 420, 422 selectively couple the bitlines of the two groups of 128 bitlines/8 data words 416, 418 to 128 sense amplifiers 426 that are arranged in 8 groups of 16, so that each group of 16 sense amplifiers 426 sense a single data word. The Y-pass multiplexers 420, 422 selectively couple the bitlines of each data word they control (1–8 or 9–16) to a single group of sense amplifiers 426 such that each single sense amplifier group of the 8 groups has either data words 1/9, 2/10, 3/11, 4/12, 5/13, 6/14, 7/15, or 8/16 selectively coupled to it. Intermediate latches 428 are coupled to the sense amplifiers 426 to hold the results of the most recent sensing cycle, allowing the sense amplifiers 426 to be utilized to sense the next 8 data words to be read. The sense amplifiers 426 contain an internal latch to hold the currently sensed bitline data value. An 8 to 1 data word decoder 430, that operates under control of a 3-bit synchronous address counter 432, couples the currently selected data word from the intermediate latches 428 to the data input/output (DIO) buffers 434 to be read from the memory device 400.

During a read operation, the Y-pass multiplexers 420, 422 are operated by a "domino" decoder 424 to select the data words to be coupled to and read by the sense amplifiers 426 from the bitlines 416, 418 of the selected column page. This is done based on the address values for the starting data word held in address latches 406 for address inputs A1–A4. For a given starting address the domino decoder 424 operates the Y-pass multiplexers 420, 422 to select only the bitlines 416, 418 for the data words that will be read, starting from the starting address and increasing in sequence. For example, if the starting address in the selected column page is data word 4, the bitlines 416, 418 for the data words that are selected and routed from the Y-pass multiplexers 420, 422 are for data words 4, 5, 6, 7, 8, 9, 10, and 11.

Because of the mapping of the data words from the Y-pass multiplexers 420, 422 to the sense amplifiers 426, there is no overlap of data words to be sensed at the sense amplifiers 426. This is particularly important when the starting data word address means that the 8 selected data words to be initially sensed are such that the 8 data words are selected from both Y-pass multiplexers 420, 422. For example, with a starting address of data word 6, the data words 6, 7, and 8 are selected from the lower Y-pass multiplexer 422 and routed to the sense amplifier groups 426 that are coupled to receive either the data words 6/14, 7/15, and 8/16 from the Y-pass multiplexers 420, 422, and the data words 9, 10, 11, 12, and 13 are selected from the upper Y-pass multiplexer 420 and routed to the sense amplifier groups 426 that are coupled to receive either the data words 1/9, 2/10, 3/11, 4/12, and 5/13.

Once the minimum latency time has passed and the sense amplifiers have sensed the currently selected data words, the intermediate latches 428 will latch in the data words in from the sense amplifiers 426. This frees the sense amplifiers 426 to be repurposed by the Y-pass multiplexers 420, 422 and the domino decoder 424 and begin sensing the next sequential set of data words. The selected data words are read from the intermediate latches 428 under control of a 3-bit synchronous address counter 432 and demultiplexer 430 which together select the individual data word to be coupled to the data input/output lines 434 to be read out of the memory device 400 for the current clock period.

To read the next 8 data words, the sense amplifiers 426 are repurposed by the domino decoder 424, typically by inverting the address value held in address latch A4 406, and couples the next 8 data word bitlines 416, 418 of the selected column page from the Y-pass multiplexers 420, 422 to the sense amplifiers 426 to be read. The domino decoder 424 selects the next 8 data words to be read in sequentially increasing address order and then will wrap around to select data words to be sensed from the beginning of the selected column page in sequential order once all other higher addressed data words in the column page have been read. For example, for the above example with the starting address of data word 4, after latching in the sensed data words 4, 5, 6, 7, 8, 9, 10, and 11 into the intermediate latches 428, the domino decoder 424 couples the bitlines 416, 418 for data words 12, 13, 14, 15, 16, 1, 2, and 3 to the sense amplifiers 426 to begin sensing.

In a burst read operation, the 3-bit synchronous address counter 432 is initially loaded with the address or "offset" within the column page of the starting data word that is held in the address latches 406 for A1–A3. Once the minimum latency time has passed and the intermediate latches 428 have latched in the data words in from the sense amplifiers 426, the synchronous address counter 432, via the output data line demultiplexer 430, selects the data word held at the starting data word address from the intermediate latches 428 and couples it to the data inputs/outputs 434 to be read from the memory device 400. With each subsequent clock pulse received on the clock input 414, the 3-bit synchronous counter 432 increments and presents the next sequentially addressed data word from the intermediate latches 428 on the data inputs/outputs 434. Additionally, as the synchronous counter 432 is only 3-bits in size, it will automatically roll over once it has counted to 8, regardless of the starting address, to allow it to address all the 8 data words held in the intermediate latches 428. For example, with a requested starting address of data word 4 in the current column page, the synchronous counter 432, after the minimum latency/sensing time delay, selects data words 4, 5, 6, 7, and 8 from the intermediate latches 428 and presents them sequentially on every clock cycle to be read from the memory device 400. The 3-bit synchronous address counter 432 then rolls over allowing it to select data words 9, 10, and 11 from the intermediate latches 428 to be read from the memory device 400.

Once all 8 current data words held in the intermediate latches 428 have been read, the sense amplifiers 426 will have completed sensing the next 8 data words from the bitlines 416, 418, which have been selected by the domino decoder 424 and the Y-pass multiplexers 420, 422. The next 8 data words are then latched into the intermediate latches 428 from the sense amplifiers 426. The 3-bit synchronous counter 432, having rolled over, will have wrapped around to begin from the same initial 3-bit starting address value and reads the 8 sequential data words from the memory device 400 as above. For example, a 16 data word read burst from the current column page starting at data word 4 would select and sense data words 4, 5, 6, 7, 8, 9, 10, and 11 during the initial minimum latency time/sensing cycle. The data words 4, 5, 6, 7, 8, 9, 10, and 11 would be latched in the intermediate latches 428 from the sense amplifiers 426. While data words 4, 5, 6, 7, 8, 9, 10, and 11 are being sequentially read from the memory device 400, the domino decoder 424 and sense amplifiers 428 select and sense data words 12, 13, 14, 15, 16, 1, 2, and 3. When data words 4, 5, 6, 7, 8, 9, 10, and 11 have been read out of the memory device 400, data words 12, 13, 14, 15, 16, 1, 2, and 3 are latched into the intermediate data latches 428 and sequentially read out of the memory device 400 in turn by the wrapped around 3-bit synchronous address counter 432 and demultiplexer 430.

When the memory device 400 reaches the highest addressed data word of the current column page it will roll over in the current column page to read the data words addressed before the starting data word address, unless it is configured to cross the column page boundary and the next column page is accessed for read sensing. When the memory device 400 crosses over a column page boundary, the starting data word address offset (the original starting word address in the starting column page) is not required because of the boundary crossing, which resets the offset to zero. This allows the domino decoder 424 to select a single pair of bitlines/Y-pass multiplexers (bitlines/multiplexer set 416 and 420, or 418 or 422) starting the lower 8 data words (bitlines/multiplexer 418 and 422) of the next column page so that a contiguous set of 8 data words to be sensed. Additionally, the 3-bit synchronous address counter 432 can be reset to an initial starting address/offset of zero.

In one embodiment of the present invention, multiple latching events/clocks are utilized in latching the data into the intermediate latches to avoid gaps and/or wait states in the read burst as the intermediate latches are changed from the initial set of 8 sensed data words to the second. For example, in the memory device of FIG. 4, a single latch event/clock is used to latch in the data for the initial set of 8 data words that are sensed. When the $8^{th}$ sequential data word of the initial set is being read from the data inputs/outputs 434 of the memory device 400, the intermediate latches 428 containing the first 7 data words are clocked to latch in the first 7 data words of the next 8 data word set. Once the $8^{th}$ data word of the set has been read and the synchronous address counter 432 is accessing the $1^{st}$ data word of the second 8 data word set, the intermediate latches 428 for final 7 data words of the second 8 data word set are clocked to latch in the new $8^{th}$ data word of the set. Alternatively, only the intermediate latch 428 containing the $8^{th}$ data word can be clocked to latch in the new $8^{th}$ data word of the second set of 8 data words. This "stuttered" latching for following sets of sensed data words allows burst read operations to continue without a clock/time gap in the read sequence from the memory device 400 as the following set of 8 sensed data words are latched into the intermediate latches. It is noted that other similar manners of latching to avoid time gaps/wait states are possible and should be apparent to those skilled in the art with the benefit of the present invention.

It is noted that other configuration of the embodiment of the present invention described of FIG. 4 incorporating different numbers and sizes of data words, Y-pass multiplexers 420, 422, synchronous address counters 432, sense amplifiers 426, and intermediate latches are possible and should be apparent to those skilled in the art with the benefit of the present disclosure.

Figure 5:
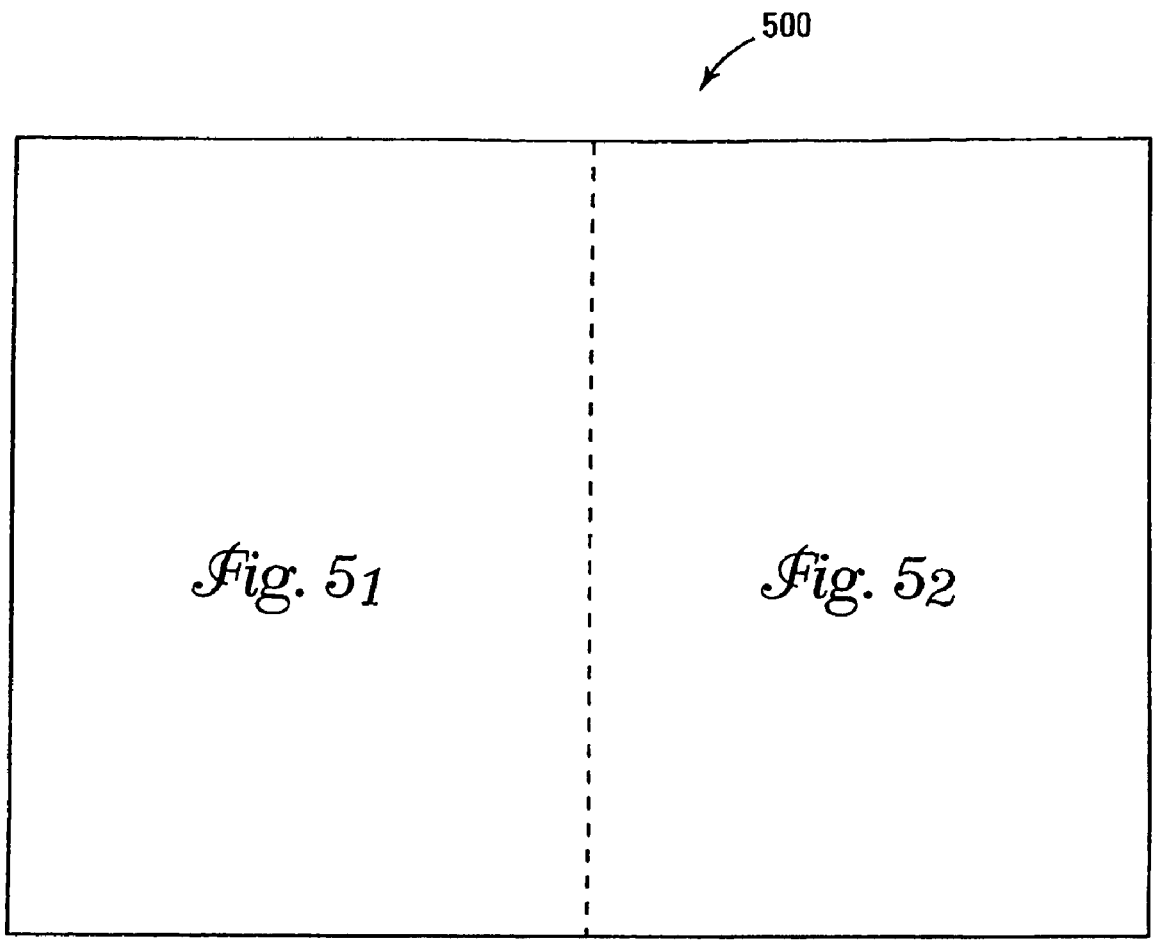
FIG. 5 is a block diagram of an output stage of a memory device in accordance with an embodiment of the present invention.
Figure 51:
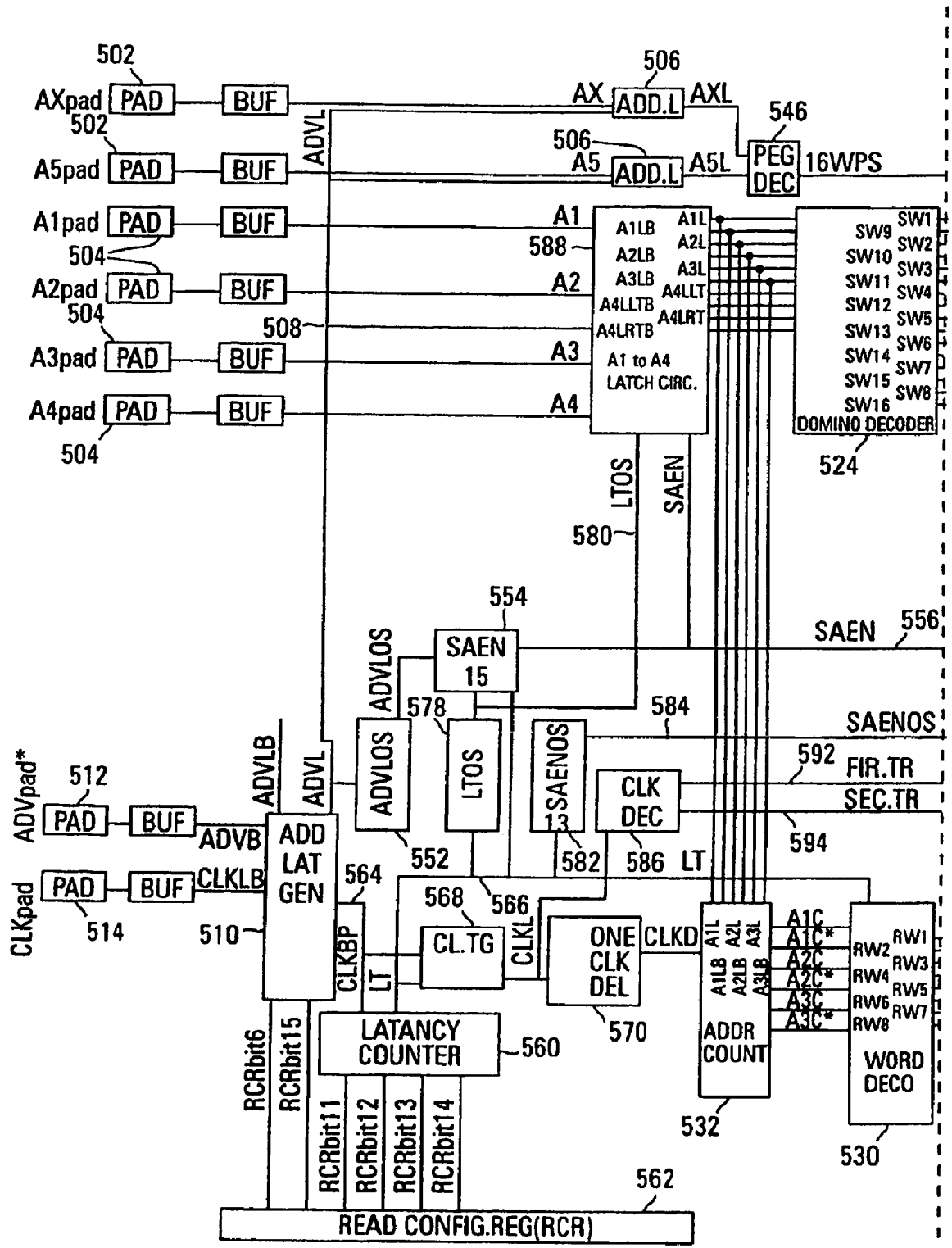
Figure 52:
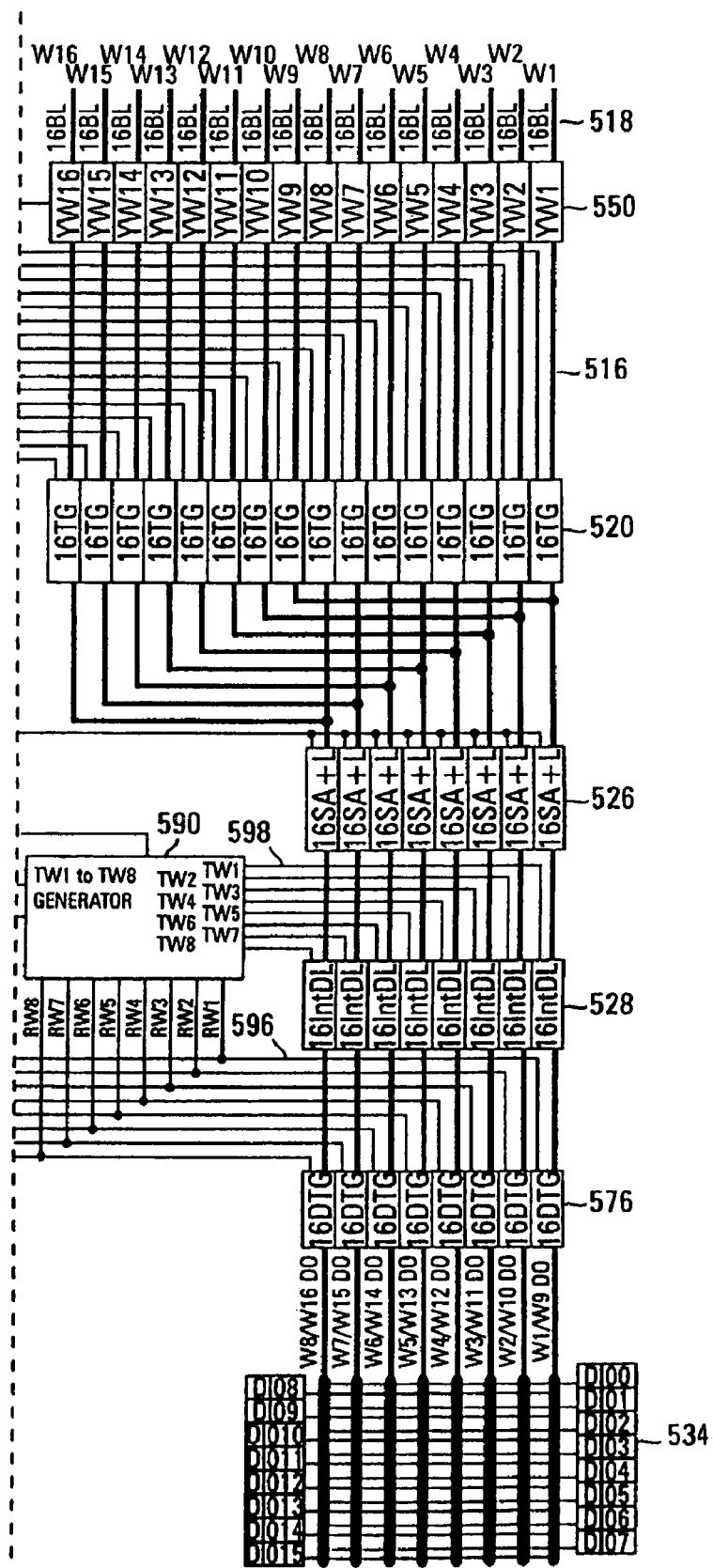

FIG. 5 shows a simplified block diagram of a Flash memory 500 of another embodiment of the present invention. In FIG. 5, a Flash memory 500 with burst read capability has a selected column page of 256 bitlines 518 coupled to a reduced set of 128 sense amplifiers 526 under control of a domino decoder 524. In operation, the Flash memory device 500 receives an address request on the buffered address input pads 502, 504. The address request is latched into the address latches 506 and 588 by the address valid latch signal 508, which is generated by the address latch generator circuit 510 from the address valid input signal 512 and clock signal input 514. The address is decoded by the row decoder (not shown) and activates a row of floating gate memory cells of the memory array (not shown). The selected row of floating gate memory cells put their data values on the column bit lines 518. The column page decoder 546 selects 16 data words of 16 bits each (for 256 total bitlines) from the bit lines 518 of the selected row of floating gate memory cells with the Y-pass gates 550 and couples them to Y-pass multiplexer transmission gates 520 that are controlled by a domino decoder 524. The domino decoder 524 selectively couples 128 bitlines dependant on the received address from the transmission gates 520 to 128 sense amplifiers 526. The sense amplifiers 526 are enabled to begin sensing the coupled bitlines by the sense amplifier enable signal 556, which is generated by the sense amplifier enable circuit 554. The sense amplifier enable circuit 554 is in turn triggered by the address valid latch one shot circuit 552, the latency counter 560, and the latency counter one shot circuit 578. The address valid latch one shot circuit 552 is coupled to and triggered by the address valid latch signal line 508, producing a pulse on the falling edge of the address valid latch signal 508.

The latency counter/timer 560 is utilized to delay access to the data value outputs of the sense amplifiers 526 until the minimum read delay/sensing cycle time has passed and the data values are available. It is loaded with an initial value from the read configure register (RCR) 562. The latency counter 560 is clocked by an internal clock signal 564 generated by address latch generator circuit 510 from the clock signal input 514. When the configured latency time has passed, the latency counter 560 outputs a latency timeout signal 566.

The latency timeout signal 566 triggers the latching of the sensed data from the sense amplifiers 526 into intermediate latches 528 and activates an 8 data word decoder 530 to begin data transfers from the memory device 500. The 8 data word decoder utilizes the address outputs of the 3-bit address counter 532, which has been loaded with an initial value/address from the lowest 3 address inputs 504, coupled from the address latches 588, to activate one of 8 read word select signals (RW1–RW8) 596. The activated read word select signal 596 selects the outputs of one group of 8 sense amplifiers via the data word transmission gates 576 and places one of the 8 16-bit data words on the input/output data buffers (I/O buffers) 534 to be read from the Flash memory device 500.

For burst mode operation the latency timeout signal 566 also activates a clock transmission gate 568, which couples the internal clock signal 564 to the 3-bit address counter 542 through a one clock delay 570. When the next clock signal pulse (or next clock pulse transition/edge if a dual data rate memory) arrives at the clock input 514, the 3-bit address counter 532 increments the current address value and advances to the next sequential address. This causes the coupled 8 data word decoder 530 to select the next sequential data word from the intermediate latches 528 and couple it to the input/output data buffers 534 to be read from the Flash memory device 500. Data words then continue to be read in this fashion on every successive clock pulse until the burst read access is ended or the final data word of the current latched data word set is read (the address counter rolls over and returns to its initial 3-bit starting value) and the next set of 8 data words of the 16 data word/256 bitline selected column page 516 are latched into the intermediate latch 528 for the read burst operation to continue. While the 8 current/initial data words are being read out of the memory device 500, the remaining/next set of 8 data words of the 16 data word/256 bitline selected column page 516 are being sensed so that they will be available to be latched into the intermediate latches 528 when required. When the final data word of a selected column page is read and the burst access is continued into the next column and/or row page, a delay is introduced, while the memory cells are selected from the memory array and/or bitlines are accessed and the minimum latency time is passed for the sense amplifiers to read the new column page, until the burst access is allowed to continue.

In the memory device 500 of FIG. 5, multiple latching events/clocks that are generated by the intermediate latch control circuit 590 are utilized in latching the data words from the sense amplifiers 526 into the intermediate latches 528. These multiple latching events/clocks are generated on the latch control lines (TW1–TW8) 598 so as to avoid gaps and/or wait states in the read burst as the data words in the intermediate latches 528 are changed from the initial set of 8 sensed data words to the second set. For example, a single latch event/clock is generated by the intermediate latch control circuit 590 on all latch control lines (TW1–TW8) 598 is used to latch in the data for the initial set of 8 data words that are sensed. When the $8^{th}$ sequential data word of the initial set is being read from the data inputs/outputs 534 of the memory device 500, the intermediate latches 528 of all but the currently selected/being read data word (the 7 data words already read) are clocked by the intermediate latch control circuit 590 to latch in the first 7 data words of the next 8 data word set. Once the $8^{th}$ data word of the first set has been read and the synchronous address counter 532 is accessing the $1^{st}$ data word of the second 8 data word set, the intermediate latch control circuit 590 clocks the intermediate latches 528 for final 7 data words of the second 8 data word set to latch in the new $8^{th}$ data word of the set.

The intermediate latch control circuit 590 is in turn controlled by the sense amplifier enable one shot signal 584, a first trigger signal 592, and a second trigger signal 594 from a clock decrement circuit 586. The sense amplifier enable one shot circuit 582 is coupled to the intermediate latch control circuit 590 and is triggered by the sense amplifier enable signal 556 and the latency timeout signal 566. The clock decrement circuit 586 is controlled by a clock signal produced by the clock gate 568 when it is activated by the latency timeout signal 566. The clock decrement circuit 586 produces a first trigger signal 592 a selected number of clocks after it is activated by the clock signal from the clock gate 568. A second trigger signal 594 is then produced from the clock decrement circuit 586 one clock pulse later to facilitate latching of the second set of data words into the intermediate latches 528 by the intermediate latch control circuit 590.

The latency timeout signal 566 also initiates the selection and sensing of the second set of data words by the domino decoder 524 and the sense amplifiers 526. The latency timeout signal 566 is coupled to and triggers the latency counter one shot circuit 578 to output a latency timeout one shot signal 580. The latency timeout one shot signal 580 triggers the address latch circuit 588 to switch the domino decoder 524 to select the second set of data words/bitlines 520 by inverting the data value for address line A4 it couples to the domino decoder 524. The latency timeout one shot signal 580 also triggers the sense amplifier enable circuit 554 to output a second active sense amplifier enable signal 556. The second active sense amplifier enable signal 556 initiates reading of the second set of data words/bitlines 516 that have been selected and coupled to the sense amplifiers 526 by the domino decoder 524 and Y-pass multiplexers 520.

Figure 6:
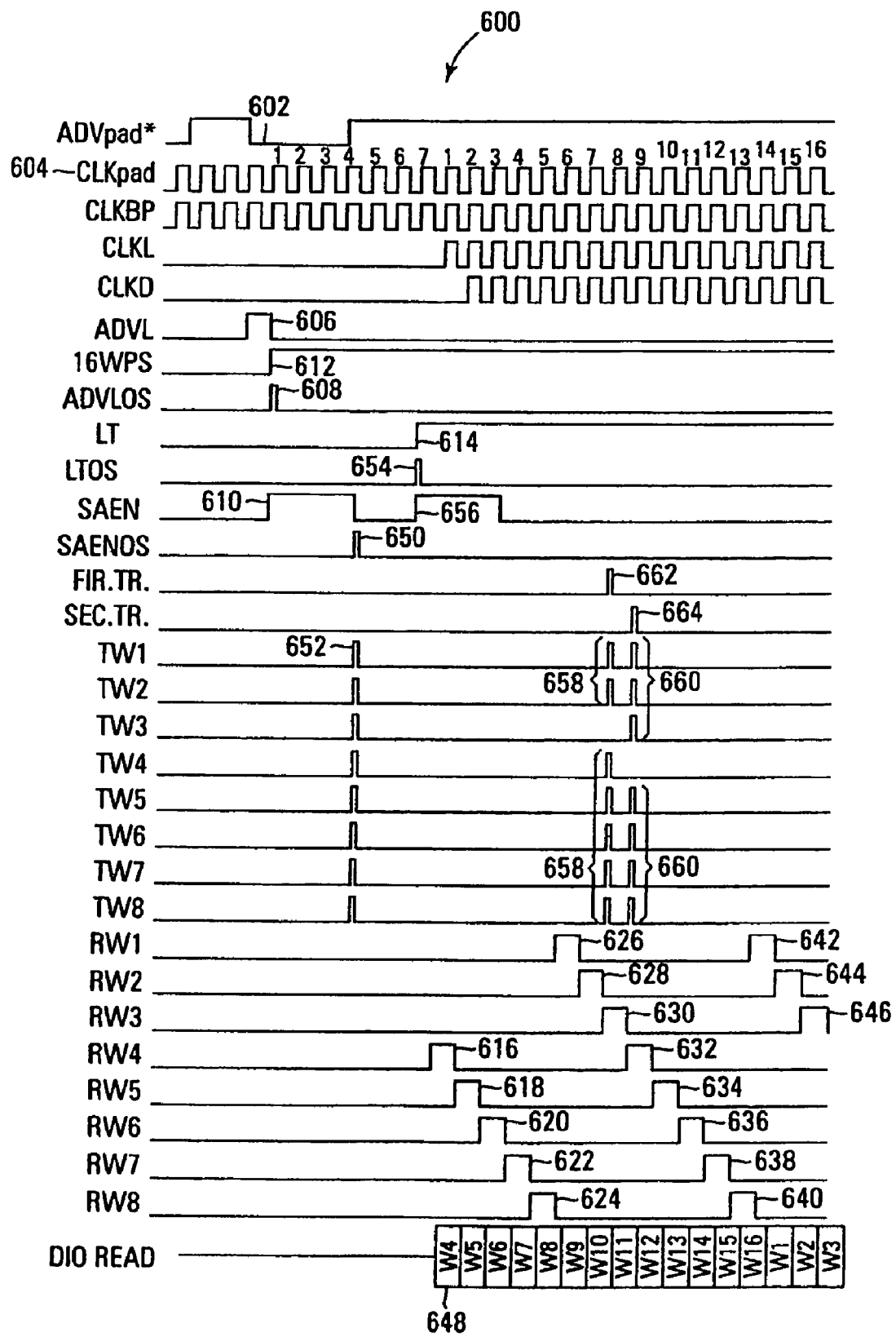
FIG. 6 is a waveform diagram showing a burst mode operation of a memory device of an embodiment of the present invention.

FIG. 6 shows a waveform diagram 600 of a 16 data word burst read operation with the Flash memory 500 detailed in FIG. 5. In the waveform diagram 600, a data request is received at the memory device 500 that accesses a selected memory row and page. The memory burst begins at data word 4 of the selected 16 data word column page and continues until data word 3. In FIG. 6, the data read request is received at the memory device on the address inputs (not shown) and is latched in by a signal on the active low address valid input (ADVpad*) 602. The active signal on the address valid input 602 in turn generates the address valid latch (ADVL) 606 and the address valid latch one shot (ADVLOS) 608 signals. The generation of the ADVL 606 signal latches in the address input values into the address latches 506, 588 and generates row and column select signals (not shown) and the 16 data word page select (16WPS) signal from the page decoder circuit 546, selecting the memory cells and coupling their bitlines 518, 516 to the Y-Pass multiplexers 520. With the latched lower 4-bit address (A1–A4) in the address latch circuit 588, the domino decoder 524 selects the data words/bitlines 516 to couple from the Y-Pass multiplexers 520 to the inputs of the sense amplifiers 526. The generation of the ADVLOS 608 signal also generates the initial sense amplifier enable signal 610 from the sense amplifier enable circuit 554, causing the sense amplifiers 526 to begin sensing the data values that have been coupled to them. At the expiration of the latency counter 560, after 7 clock 604 periods, the latency timeout (LT) signal 614 becomes active. After a selected delay, the sense amplifier enable circuit 554 inactivates the initial sense amplifier enable signal 610, which triggers the sense amplifier enable one shot 650. This causes the intermediate latch control circuit 590 to clock/trigger 652 all of the intermediate latches 528 to latch the first set of data words sensed by the sense amplifiers 526.

The latency timeout signal 614 activates the 3-bit address counter 532 and enables the 8 data word decoder 530. The 3-bit address counter 532 has been pointed to decode and select the first data word 596 according to the value of address (A1–A3) first latched into the address latch circuit 588. The latched address values, "011", address data word 4 of the first sensed data word set of the selected column page and causes the 8 data word decoder 530 to output read word select 4 (RW4) 616, which couples the output of intermediate latches 528 for data word 4 to the data input/output buffer 534. This allows data word 4 to be read 648 from the memory device 500.

The active latency timeout signal 614 also triggers the latency timeout one shot signal 654, which causes the address latch circuit 588 to change the domino decoder 524 to the second selected set of data words/bitlines 516 of the selected column page. This is accomplished by the address latch circuit 588 changing the polarity of the A4 address line, which is coupled to and controls the domino decoder 524. The latency timeout one shot signal 654 also triggers the sense amplifier enable circuit 554 to output a second sense amplifier enable pulse 656, prompting the sense amplifiers 526 to begin reading the second set of selected data words/bitlines 516 coupled to them by the domino decoder 524 and the Y-Pass multiplexers 520 while the first set of sensed data words are read out of the memory device 500 from the intermediate latches 528.

In the burst read operation, as subsequent clock pulses are received on the clock signal input (CLKpad) 604, the 3-bit address counter 532 is advanced to the next data word address. This causes the coupled 8 data word decoder 530 to output the next subsequent read word select. The 3-bit address counter 532 transitions on each subsequent clock cycle 604 from the initial data word address of 4 to 8, and then rolls over/wraps around to begin counting from 1 again until 3 is reached. In response to the 3-bit address counter 532, the 8 data word decoder 530 selects in turn RW4 616, RW5 618, RW6 620, RW7 622, RW8 624, RW1 626, RW2 628, and RW3 630. This causes the associated data values of the first selected set of data words to be sequentially output 648 from the memory device 500.

While the 8$^{th}$ data word of the first set (data word 11, under RW3 630 in the example of FIG. 6) is read out of the memory device 500, the intermediate latch control 590 stutter steps the intermediate latches 528 to latch in the data words of the second set to be read, so as to avoid any gaps or waits states in the burst read operation. In doing this, triggered by the first trigger signal 662 (after the 7$^{th}$ data word of the first set, data word 10 under control of RW2 628, is read out of the memory device 500), the intermediate latch control 590 clocks 658 the intermediate latches of all but the current data word being read (data word 11, currently selected by RW3 630). After the 8$^{th}$ data word has been read the intermediate latch control 590, triggered by the second trigger signal 664, clocks 660 the intermediate latches once again of all but the current data word being read (data word 12, currently selected by RW4 632) to complete the latching of the second data word set from the sense amplifiers 526.

The second data word set is then read out of the memory device 500 under control of the 3-bit address counter, which will have wrapped around to the initial address value 4 ("011"), and corresponds to data word 12 in the currently loaded second data word set. The 3-bit address counter 532 will transition on each subsequent clock cycle 604 from the initial data word address of 12 to 16 and then roll over to begin counting from 1 again until 3 is reached. In response to its input from the 3-bit address counter 532, the 8 data word decoder 530 selects in turn RW4 632, RW5 634, RW6 636, RW7 638, RW8 640, RW1 642, RW2 644, and RW3 646. This causes the associated data values of the second selected set of data words to be sequentially output 648 from the memory device 500.

When the memory device 500 reaches the highest addressed data word of the current column page it will roll over in the current column page to read the data words addressed before the starting data word address, unless it is configured to cross the column page boundary and the next column page is accessed for read sensing. When the memory device 500 crosses over a column page boundary, the starting data word address offset (the original starting word address in the starting column page) is not required because of the boundary crossing, which resets the offset to zero. This allows the 3-bit synchronous address counter 532 to be reset to an initial starting address/offset of zero.

It is noted that the initial data word access in the above example started at data word 4 of the selected column page and that other starting data word accesses and burst sizes are possible and will operate in a substantially similar manner. It is also noted that burst read operations with other embodiments of the present invention based on other types of memory devices are possible and should be apparent to those skilled in the art with the benefit of the present invention.

A domino decoder in embodiments of the present invention is, in combination with the address latch circuit, designed to select sets of data words to be sensed that are matched to the number of available sense amplifiers in an increasing order given a starting address in within the selected column page. The sets of data words are selected within the column page such that the initial set is selected starting at the first addressed data word and includes sequentially increasing addressed data words to create a set of data word bitlines to couple to the available sense amplifiers. The following sets of data words are selected by the domino decoder and address latch circuit in a sequentially increasing address manner, and continue within the column page from where the previously selected set left off. Once the end of the column page is reached, the address latch circuit/domino decoder wraps around in the column page and selects data words starting from the first data word in the column page. Once the address latch circuit/domino decoder has wrapped around the column page boundary any additional sequential data word sets will be selected in a sequentially increasing manner from the beginning of the column page; unless the memory device is configured to cross the column page boundary and the next column page is accessed for read sensing.

Figure 11A:
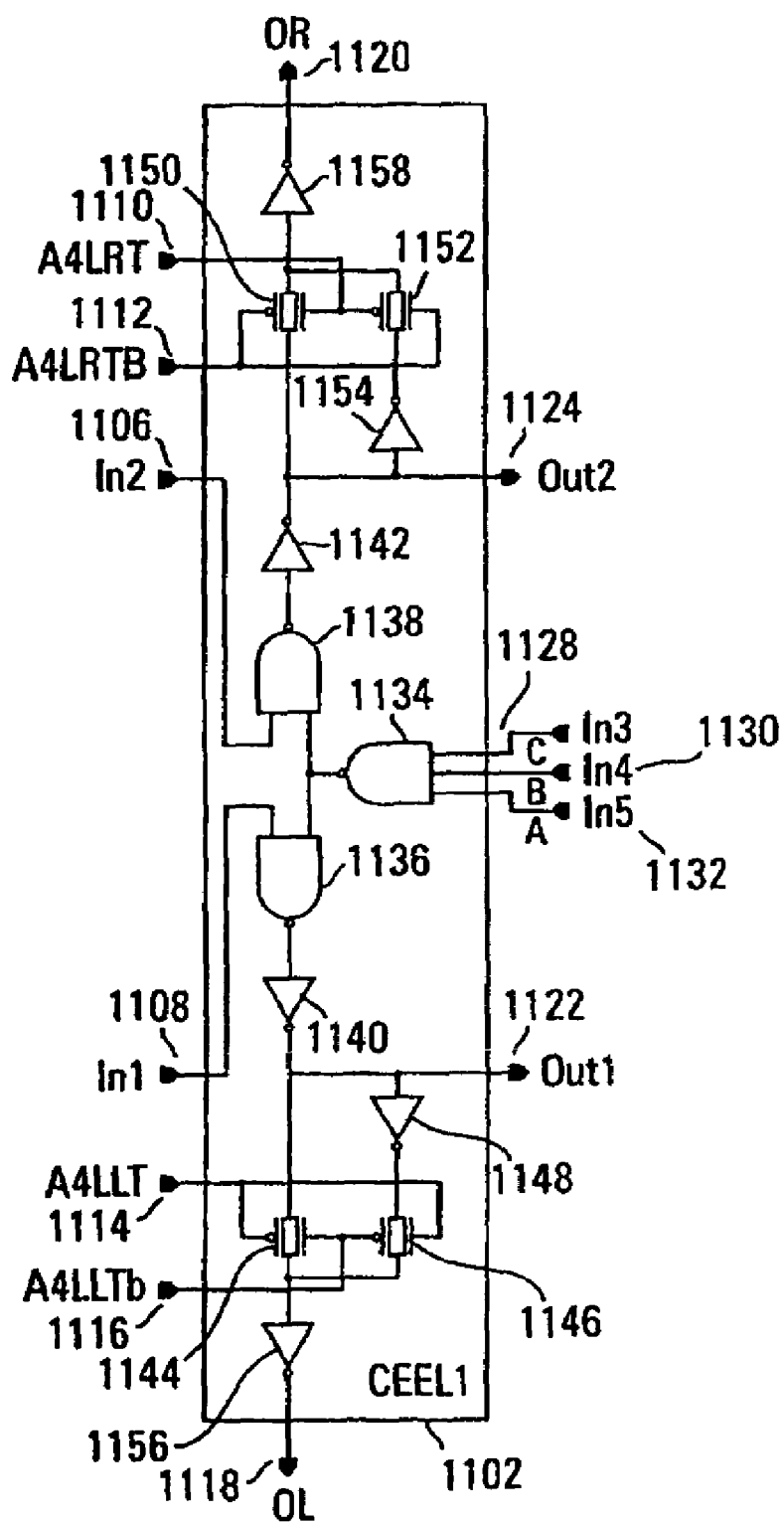

A domino decoder 1100 as could be utilized in the embodiments of the present invention of FIGS. 4 and 5 is detailed in FIGS. 11A and 11B. In FIG. 11B a domino decoder 1100 containing 8 decoding cells 1102 is shown. The domino decoder 1100 combines the aspects of a decoder with adder-like carry out propagation to produce a sliding window selection of 8 of 16 data words for a given latched starting data word address.

In operation, the inputs In1 1108 and In2 1106 of the first cell 1104 of the domino decoder 1100 are coupled to Vcc to input a logical one for initial carry propagation purposes. The inputs of the address A4 in the inputs A4LRT 1110, A4LRTb 1112, A4LLT 1114, and A4LLTb 1116 select the data word on its select line outputs, OR 1118 and OL 1120 (W1 or W9), from the upper or lower half (also referred to as the right and left half) of the selected column page that the first cell 1104 will couple to the sense amplifiers (not shown) with the Y-pass multiplexer (not shown). The first cell 1104 outputs a carry propagation on Out1 1122 and Out2 1124 that is a logical one, forces all the cells 1102 downstream of the first cell 1104 to select their data words in the same manner (from the same half of the column page) as the first cell 1104, directed by the value of address line A4 on the inputs A4LRT 1110, A4LRTb 1112, A4LLT 1114, and A4LLTb 1116. This continues until the cell that is selected by the input 3-bit initial address/offset is reached.

A cell 1102 of the domino decoder 1100 is selected by the input of the lower 3-bit address that it is configured to match/decode to. This is accomplished by how it is coupled to the inverted and non-inverted lower 3-bit latched address lines, A1–A3 1126, (A1L, A2L, A3L, A1Lb, A2Lb, and A3Lb). The 8 cells 1102 of the domino decoder 1100 are assigned so that only a single cell 1102 of the 8 matches each possible address input of the lower 3-bits A1–A3. Once a cell 1102 of the domino decoder 1100 matches its assigned 3-bit address, it outputs a carry out propagation on its Out1 1122 and Out2 1124 that is a logical zero to the inputs, In1 1108 and In2 1106, of the remaining cells 1102 downstream of it in the domino decoder 1100. This logical zero on the carry out propagation 1122, 1124 forces the selected cell 1102 and the remaining downstream cells 1102 to select data words to couple to the sense amplifiers from the opposite half of the column page that the initial cells of the domino decoder select based on the A4 address value. When the A4 address value inverts, after the latency timeout/triggering of the intermediate latches to capture the sensed initial set of data words, the cells of the domino decoder switch their outputs 1118, 1120 to select the other data word of the two data word set that they control. Thus the domino decoder couples the second, not initially selected, set of data words to the sense amplifiers to be sensed.

In FIG. 11A, a single cell 1102 of the domino decoder 1100 is detailed that would be utilized to select between 2 data words of a set of 16, given a 4-bit starting data word address. Inputs In1 1108 and In2 1106 of the cell 1102 accept the carry propagation input from the previous cell 1102 in the domino decoder 1100. The inputs In3 1128, In 4 1130, and In 5 1132 accept inputs for the logical combination of the lower 3-bit address values 1126 that denote the cell's 1102 position in the domino decoder 1100. Address inputs A4LRT 1110, A4LRTb 1112, A4LLT 1114, and A4LLTb 1116 accept inputs for the fourth, most significant, address bit of the 4-bit starting address and selects the data word that the cell will couple to the sense amplifiers in combination with the coupled carry inputs, In1 1108 and In2 1106. The domino decoder cell 1102 is designed to accept the inputs A4LRT 1110, A4LRTb 1112, A4LLT 1114, and A4LLTb 1116 from a latch circuit that will invert the value of the latched address line A4 to read the second set of data words of the selected column page. "Carry" outputs, Out1 1122 and Out2 1124, propagate the carry to the next downstream cell 1102. Data word select outputs, OL 1118 and OR 1120, select one of the two data words (one each from the right and left halves of the selected column page) controlled by the cell 1102 for the Y-pass multiplexers to couple to a sense amplifier group to be sensed.

Internally, the cell 1102 matches the address it has been coupled to recognize from the lower 3-bit address lines 1126 with a 3-input NAND gate 1134. If the 3-input NAND gate 1134 has not recognized the cell's 1102 assigned address, it outputs a logical one. The 2-input NAND gate 1136 is coupled to In1 1108 and the output of the 3-input NAND gate 1134, and 2-input NAND gate 1138 is coupled to In2 1106 and 3-input NAND gate 1134. The output of 2-input NAND gate 1136 is coupled to Out1 1122 through inverter 1140 and the output of 2-input NAND gate 1138 is coupled to Out2 1124 through inverter 1142. The output of the 2-input NAND gate 1136 through inverter 1140 is also coupled to transmission gate 1144 and to transmission gate 1146 though inverter 1148. The output of 2-input NAND gate 1138 through inverter 1142 is also coupled to transmission gate 1150 and to transmission gate 1152 though inverter 1154. The output of transmission gate 1144 and transmission gate 1146 are coupled to the data word select, OL 1118, through inverter 1156. The output of transmission gate 1150 and transmission gate 1152 are coupled to the data word select, OR 1120, through inverter 1158. The operation of transmission gate 1144 and transmission gate 1146 are controlled by the address line A4 inputs A4LLT 1114 and A4LLTb 1116 to decode the address line A4 and select the inverted or non-inverted carry output of the 2-input NAND gate 1136 and inverter 1140 to couple to the data word select, OL 1118, through inverter 1156. The operation of transmission gate 1150 and transmission gate 1152 are controlled by the address line A4 inputs A4LRTb 1112 and A4LRT 1110 to decode the address line A4 and select the inverted or non-inverted carry output of the 2-input NAND gate 1138 and inverter 1142 to couple to the data word select, OR 1120, through inverter 1158.

In operation, if the cell 1102 has not matched its configured address (by the 3-input NAND gate 1134 outputting a logical one) the 2-input NAND gates 1136 and 1138 will output a logic state that matches their coupled inputs In1 1108 and In2 1106, through their respectively coupled inverters 1140 and 1142, to the carry outputs, Out1 1122 and Out2 1124. If the cell has matched its configured address, the 3-input NAND gate 1134 will output a logical zero and the 2-input NAND gates 1136 and 1138 and their respectively coupled inverters 1140 and 1142 will output a logical zero to the carry outputs, Out1 1122 and Out2 1124 no matter what the inputs from In1 1108 or In2 1106 (Out1 1122 and Out2 1124 will both be zero for a cell which is matched to its configured address. The data word select output OL 1118 will output a select that is dependent on the carry output state (Out1 1122 and Out2 1124) coming from the previous cell 1102 and will be the inverse of data word select OR 1120. The A4 address line inputs of A4LRT 1110, A4LRTb 1112, A4LLT 1114, and A4LLTb 1116 invert the original states of data word select output OL 1118 and OR 1120 (due to their coupling to the transmission gates 1144, 1146, 1150, 1152) when the address data latch circuit inverts the latched state of address line A4, providing access to the second data word controlled by the cell 1102.

Figure 12B:
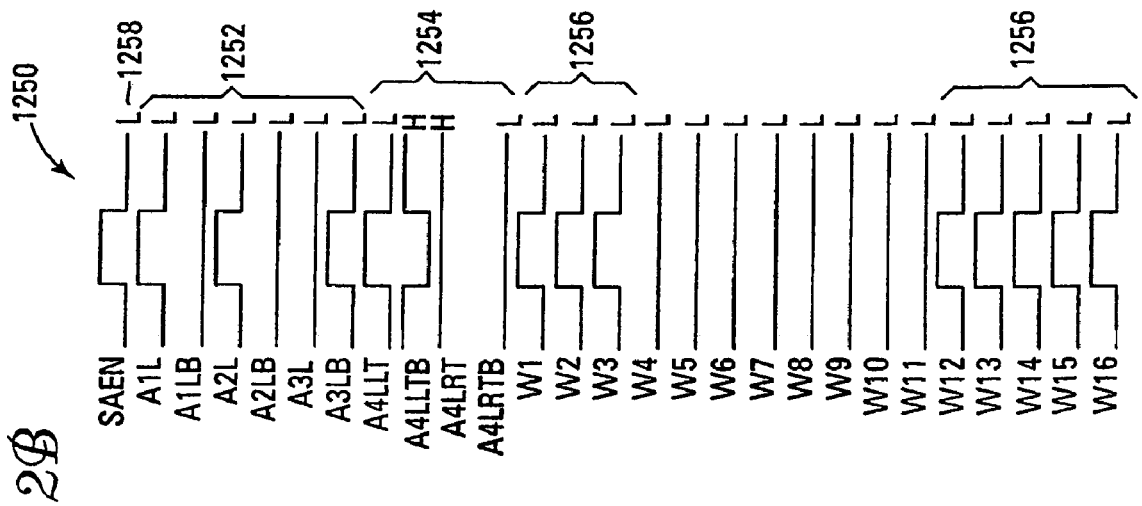
FIGS. 12A and 12B are waveform diagrams detailing the signals of a domino decoder of an embodiment of the present invention.
Figure 12A:
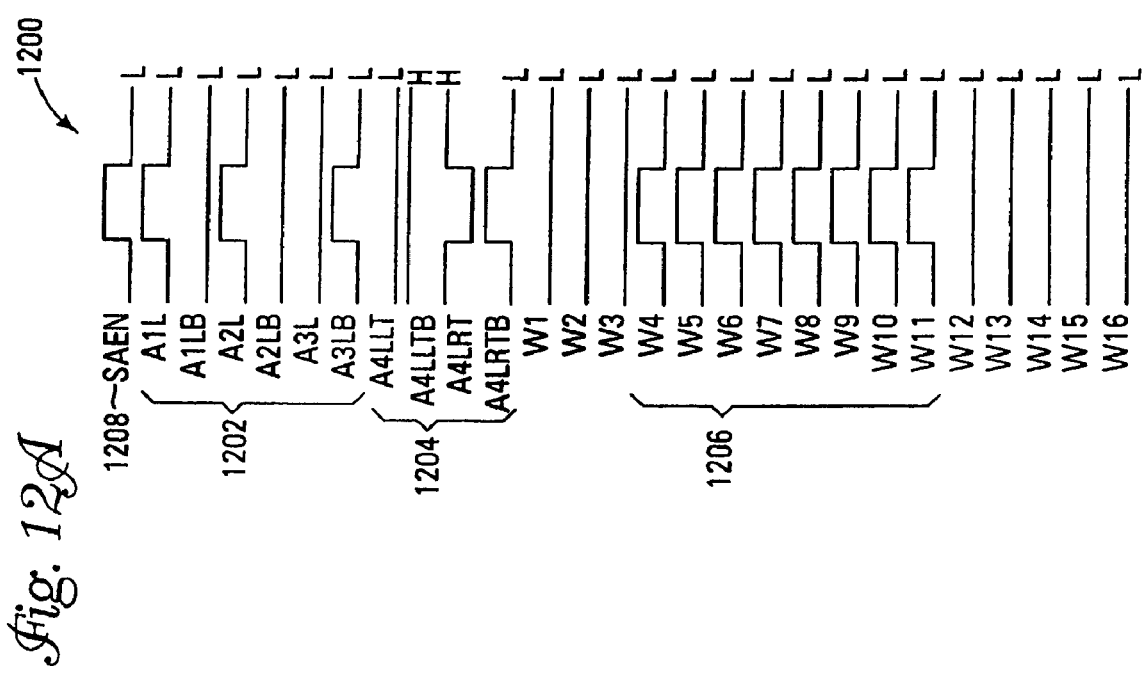

FIGS. 12A and 12B detail example waveforms of the domino decoder 1100 of FIGS. 11A and 11B. In FIG. 12A a domino decoder waveform 1200 for a 4-bit address of "1100" on address lines A1–A4 is shown. During the sense amplifier enable pulse 1208, the lower 3-bit latched addresses (A1–A3) 1202 of "110" are available in inverted and non-inverted form for coupling to the address decoder NANDs 1134 of the individual domino decoder cells 1102. The A4 address line in a "0" state is available in inverted and non-inverted form 1204 and coupled to control the right, OR 1120, and left, OL 1118, data word select outputs of the individual cells 1102 of the domino decoder 1100. The value of "110" on the lower 3 address lines (A1–A3) 1202 selects the fourth cell of the domino decoder and all the cells following the fourth cell 1102 (cells 5, 6, 7, and 8). Address line input A4 being zero, expressed on A4LRT, A4LRTb, A4LLT, and A4LLTb 1204, will activate the selects for data words W4, W5, W6, W7, and W8 1206 on the right side 1120 (output right, OR) and the inverted carry outs (Out1 1122, Out 1124) after the selected fourth cell 1102 activates the selects for data words W9, W10, and W11 1206 on the left side 1118 (output left, OL).

In FIG. 12B a domino decoder waveform 1200 for a 4-bit address where the value of the address line A4 is inverted to give an address of "1101" (A1–A4) is shown. In FIG. 12B, during the sense amplifier enable pulse 1258, the lower 3-bit latched addresses (A1–A3) 1252 of "110" are available, as in FIG. 12A, in inverted and non-inverted form for coupling to the address decoder NANDs 1134 of the individual domino decoder cells 1102. The A4 address line in a "1" state is available in inverted and non-inverted form 1254 and coupled to control the right, OR 1120, and left, OL 1118, data word select outputs of the individual cells 1102 of the domino decoder 1100 in a form that is inverted to the waveform of FIG. 12A. The value of "110" on the lower 3 address lines (A1–A3) 1202 selects the fourth cell of the domino decoder in the same manner as the waveform of FIG. 12A (Address lines A3–A1 1252 do not change). However, the polarity of address line A4 is changed from the waveform of FIG. 12A, so the polarity of the data word select outputs, OL 1118 and OR 1120, are changed (inverted from FIG. 12A). In this manner, the domino decoder 1100 activates the data word selects for W1, W2, and W3 1256 for the right side (OR) 1120 and the data word selects for W12, W13, W14, W15, and W16 1256 for the left side (OL) 1118.

The domino decoder of FIGS. 11A and 11B can be used with some modification in any column page that is divisible by a power of 2, as long as the underlying circuitry and sense amplifiers of the memory are fast enough to match the data transfer rate, as detailed above. This can be accomplished by increasing the number of divisions in the column page by powers of 2 (i.e., 2^N) by linearly increasing the number of output controlling address inputs (N) of the most significant bits of the lower address and the number of data words by a power of 2 that each individual cell 1102 of the domino decoder 1100 decodes into from the output controlling address inputs (N) (for example, utilizing A4 and A3 in a cell 1102 to select 1 of 4 data words assigned to the cell 1102 to decode into and couple to the sense amplifiers). Additionally, this decreases the number of domino decoder cells 1102 contained in the domino decoder 1100 by half for each new control address line (A4, A3) used to decode/select data words to couple to the sense amplifiers. Each cell must then internally increase in size to increase the number of data words that it controls/selects to couple to a single group of sense amplifiers.

The selected column page width may also be increased by increasing the number of cells 1102 in a domino decoder 1100, and increasing the size of the internal address NAND 1134 of each cell 1102. For example, so that one cell of a 2^X domino decoder is selected, an internal addressing NAND 1134 of X inputs accepting X lower address bits is required.

Figure 9:
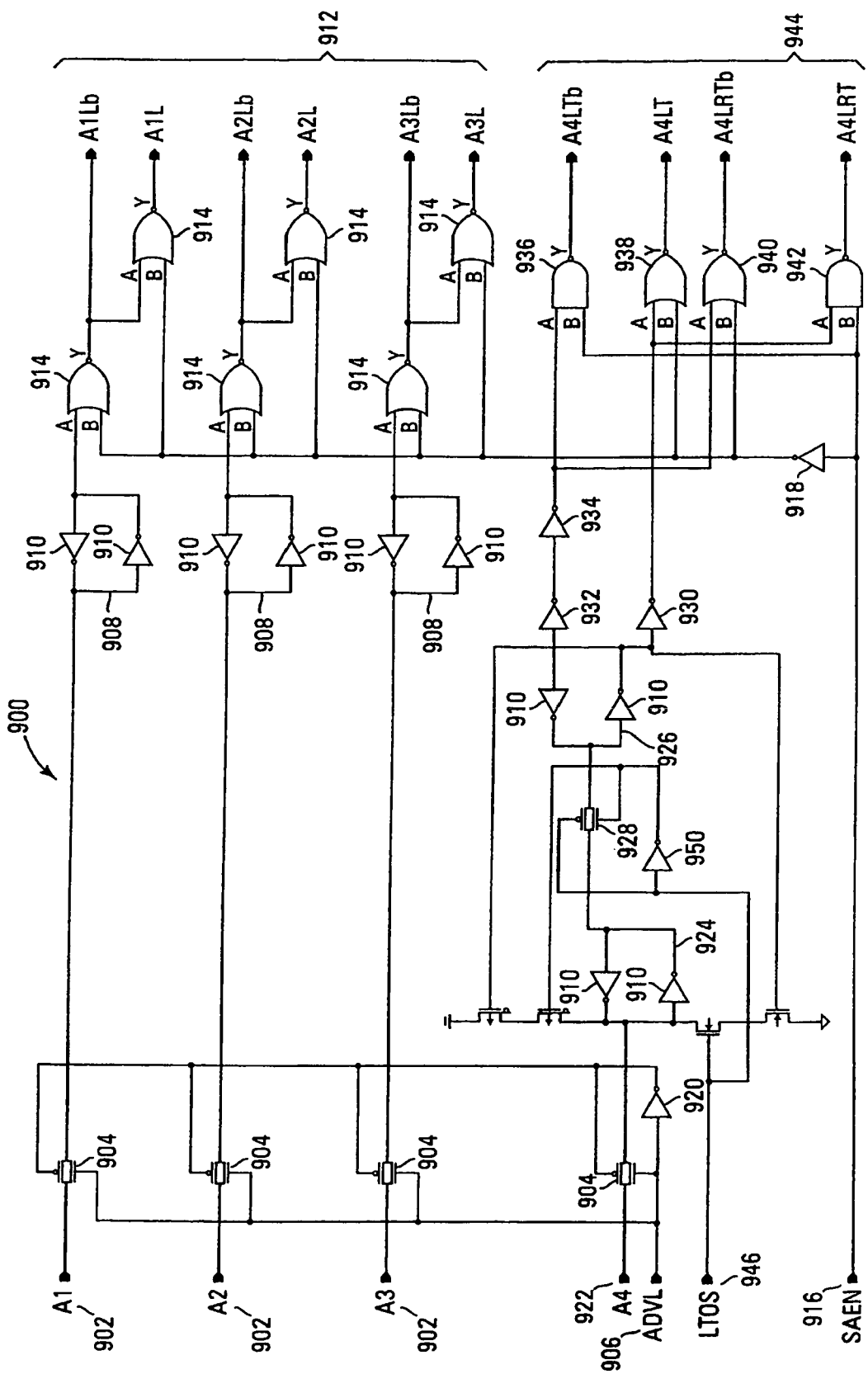
FIG. 9 is a diagram of the A1–A4 latches and associated logic of a memory in accordance with an embodiment of the present invention.
Figure 10:
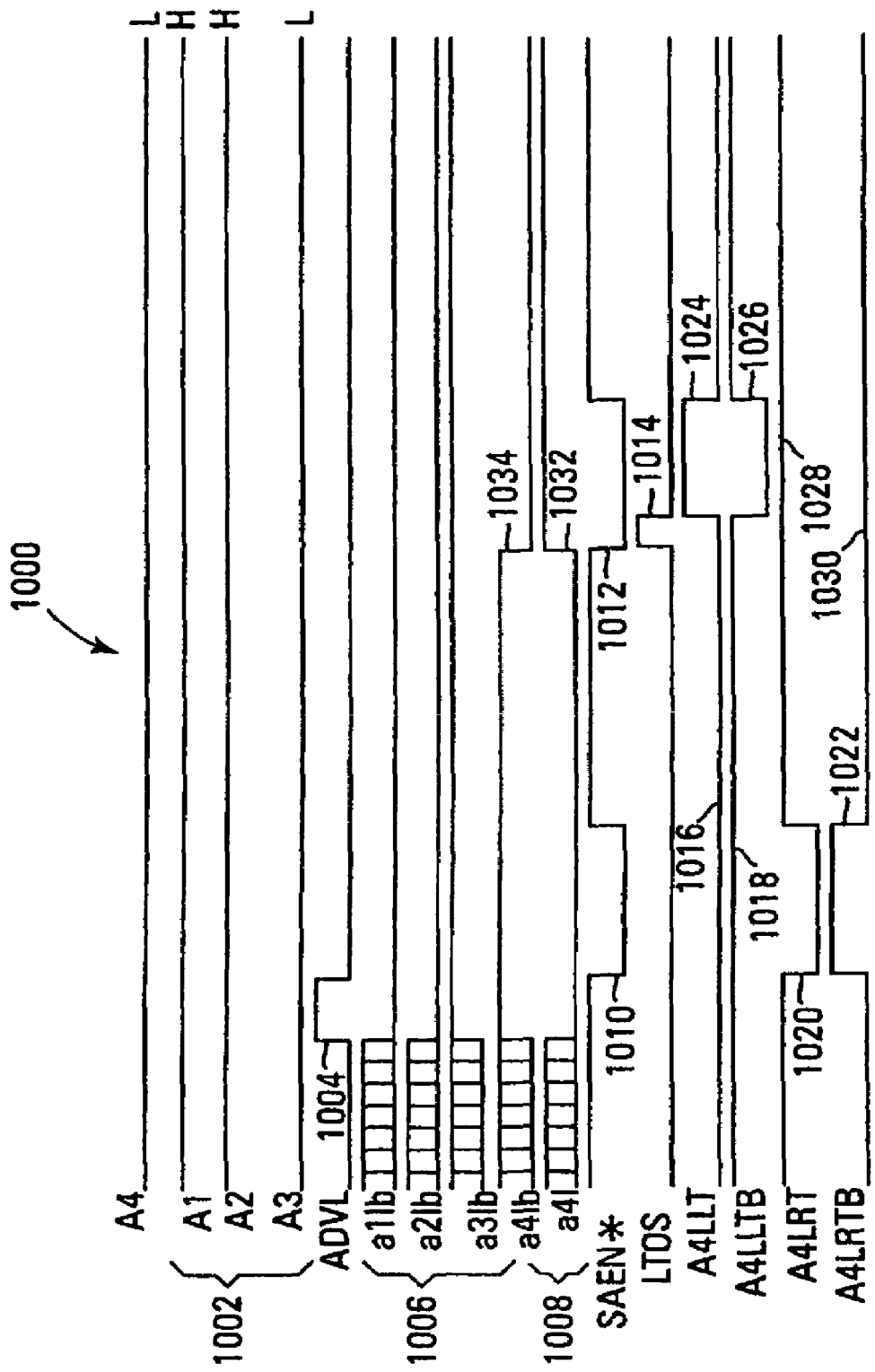
FIG. 10 is a waveform diagram detailing the signals of the A1–A4 latches and associated logic of an embodiment of the present invention.

In FIGS. 9 and 10, an address latch circuit and its waveforms of an embodiment of the present invention are detailed. In FIG. 9, an address latch circuit 900 having 4 address inputs (A1–A4) 902, 922 is shown. The address latch circuit 900 passes the address inputs 902 through transmission gates 904 to be latched by the address latches 908 when they are activated by the address valid latch signal (ADVL) 906. The address latches 908 are constructed of two inverters 910 that are coupled into a feedback loop so that they hold a state. The states held in the address latches 908 for the lower 3-bits of the 4-bit address are made available in inverted and non-inverted form by coupled NOR gates 914 on outputs A1L, A1Lb, A2L, A2Lb, A3L, and A3Lb 912. The NOR gates coupled to act as enabled inverters and are enabled by the sense amplifier enable signal (SAEN) 916 that is coupled through inverter 918. Address line A4 922 is coupled to a first latch 924 through a transmission gate 904. The address value of the first latch 924 is connected to a second latch 926 through transmission gate 928 all the time except when the latency timeout one shot signal (LTOS) 946, which is partially coupled to the transmission gate through inverter 950, is logically high. For the first sensing cycle of 8 data words, the latch value of A4 is preserved at the output of latch 926. For the second sensing cycle of 8 data words, the latency one shot signal (LTOS) 946 goes high for a short period of time, which disconnects the first latch 924 from the second latch 926 by disabling transmission gate 928. At the same time, the latency one shot signal (LTOS) 946 in a logical high state changes the polarity of the address value A4 stored in the first latch 924. When latency one shot signal (LTOS) 946 transitions back from logical high to low, the first latch 924 is reconnected to the second latch 926 by the enable transmission gate 928, and the inverted value of address line A4 is transferred through to the output of the second latch 926. The address value in the second latch 926 is coupled in inverted and non-inverted form through inverters 930, 932, and 934 to the NAND gates 936 and 942 and NOR gates 938 and 940. The NAND gates 936 and 942 and NOR gates 938 and 940 are coupled to produce the cell output controlling address inputs A4LRT, A4LRTb, A4LLT, and A4LLTb 944. The NAND gates 936 and 942 and NOR gates 938 and 940 are enabled by the sense amplifier enable signal 916 and the inverted sense amplifier enable signal 916 from inverter 918.

FIG. 10 details waveforms 1000 of an example operation of the address latch circuit 900 of FIG. 9 are shown. In FIG. 10, the latched address values of address lines A1–A3 are shown in non-inverted 1002 (A1, A2, and A3) and inverted 1006 (A1b, A2b, and A3b) form, showing a lower 3-bit address of "110". The latched address value of set control address line A4 1008 is also shown in non-inverted (A4L) and inverted form (A4Lb), showing an initial A4 address value of "0". In operation, the address latch circuit 900 receives a first sense amplifier enable active pulse 1010, and asserts address lines A1–A3 1002, 1006. The initial value of address line A4 1008 for the right side column page multiplexer select of the column page in non-inverted and inverted form on A4LRT 1020 and A4LRTb 1022, and the left side column page multiplexer select of the column page in non-inverted and inverted form on A4LLT 1016 and A4LLTb 1018, respectively. This selects the half of the column page that the initially addressed data word is in and its following sequential addresses for access. Upon occurrence of the latency timeout one shot (LTOS) signal 1014 and the second sense amplifier enable signal 1012, the value of the stored A4 address line is inverted 1032, 1034. A second, inverted signal is output for the address line A4 1008 for the right side column page multiplexer select of the column page in non-inverted and inverted form on A4LRT 1028 and A4LRTb 1030, and the left side column page multiplexer select of the column page in non-inverted and inverted form on A4LLT 1024 and A4LLTb 1026, respectively.

In FIGS. 7 and 8, an address latch generation circuit 700 and its waveforms 800 of an embodiment of the present invention are detailed. The address latch circuit 700 of FIG. 7 contains a clock polarity circuit 718 containing inverters 708 and 706 and transmission gates 710 and 712 that inverts the input clock signal 702, 806 under control of the control register bit RCRbit6 704, 802. The input clock signal 702, 806 is coupled from the clock polarity circuit 718 to the clock pulse generator circuit 720, where a short duration clock pulse 808 is created by coupling the clock to both inputs of NAND gate 714 directly, and through 3 series coupled inverters 716. The short duration clock pulse 808 of the clock pulse generator circuit 720 is coupled to a clock transfer circuit 722. The address valid latch signal 726, 810 and RCRbit 15 bit signal 728, 804 from the memory configuration register are also coupled to the clock transfer circuit 722. The clock one shot circuit generates a logical zero/low output of a one clock duration after receiving an address valid signal 726 and resetting to a logical one/high output after the receiving a following short duration clock pulse 808 from the clock pulse generation circuit 720. The address valid signal 726, 810 and the output from the clock transfer circuit 722 are coupled to a 2-input NOR gate 726. A received address valid signal 726, 810 pulse 818 that sets the output latch 724 to output a logical zero at ADVL* 812. The second rising edge of the CLKB signal 806 will reset the output latch 724 through the COS signal 808 going high 816.

Figure 13:
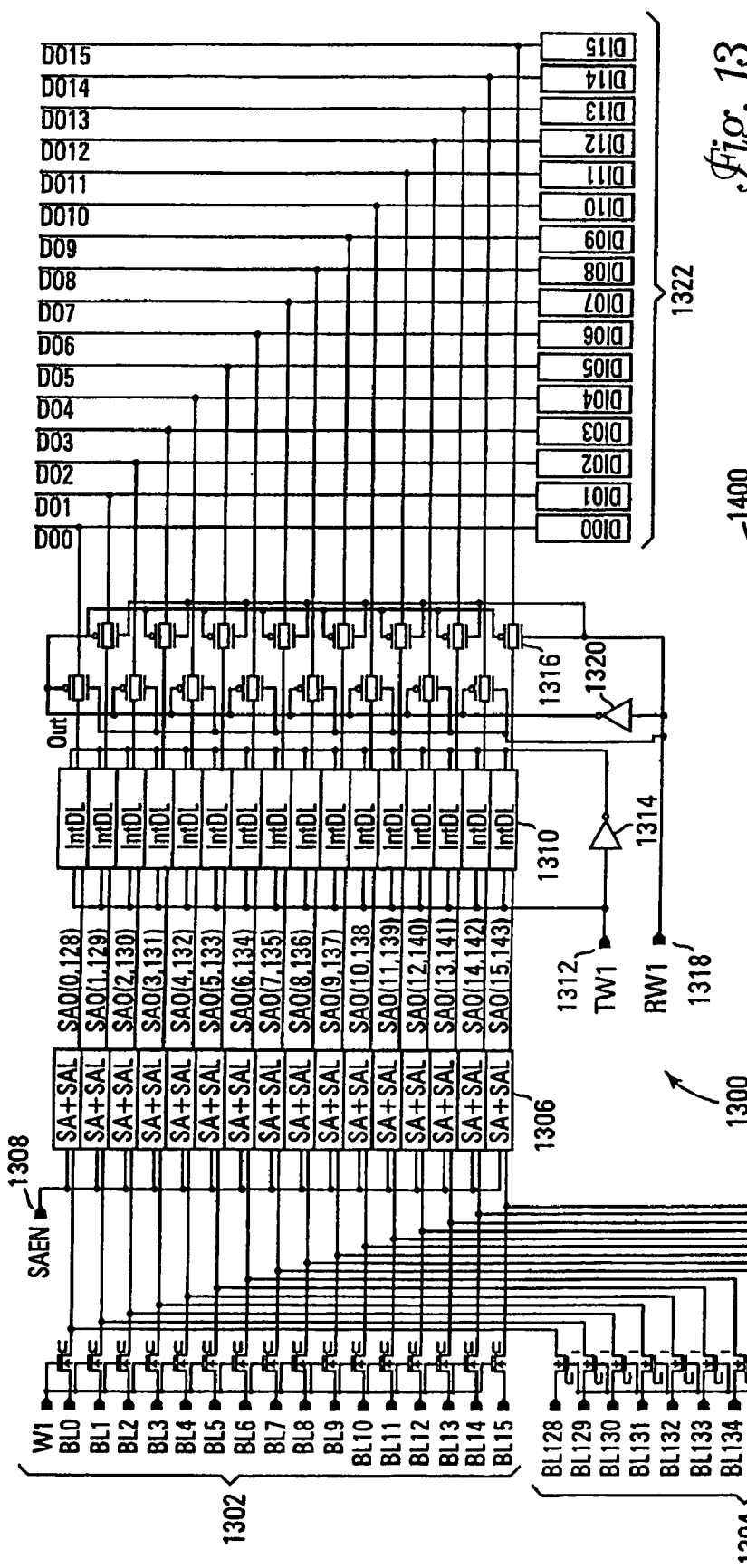
FIG. 13 is a diagram of the read pass, multiplex, sense amplifiers, and intermediate data latches of a memory in accordance with an embodiment of the present invention.
Figure 14:
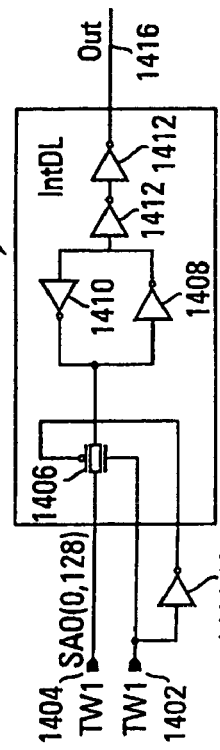
FIG. 14 is a diagram of an intermediate data latch of a memory in accordance with an embodiment of the present invention.

In FIGS. 13 and 14, an intermediate latch circuit 1400 and the read path for a single 2-data word grouping 1300 of an embodiment of the present invention are detailed. In FIG. 13, the 2-data word read path 1300 has a set of Y-pass multiplexers 1302, 1304 to pass the bitlines of 2 data words (W1 1302/W9 1304) of the selected column page under control of a domino decoder (not shown). A group of 16 sense amplifiers 1306 sense the 16 bits of the coupled data word from the Y-pass multiplexers 1302, 1304 when enabled by the sense amplifier enable signal 1308. A group of 16 intermediate latches 1310 latch the sensed data from the coupled sense amplifiers 1306 upon receiving a latch control signal/clock (TW1) 1312, which is coupled directly and indirectly to the intermediate latches 1310 through inverter 1314. The read select signal (RW1) 1318, directly and indirectly coupled to transmission gates 1316 through inverter 1320, couples the latched data contained in the intermediate latches 1310 to the data input/outputs 1322. In FIG. 14, an intermediate latch 1310, 1400 is detailed. The intermediate latch 1310, 1400, has a transmission gate 1406 that couples the input sense amplifier output 1404 to a latch circuit formed from two feedback coupled inverters 1410, 1408, under control of the latch control signal/clock (TW1) 1402, 1312, which is coupled directly and indirectly to the intermediate latch 1400 through inverter 1414, 1314. Output 1416 from the intermediate latch 1400 is buffered through two serial coupled inverters 1412.

In FIGS. 15A and 15B, a sense amplifier enable circuit 1500 and its waveforms 1550 of an embodiment of the present invention are detailed. The sense amplifier enable circuit 1500 produces a sense amplifier enable output pulse 1538, 1540 of a selected time period upon receiving either a latency timeout signal one shot pulse 1544 or an address valid latch one shot pulse 1542. The sense amplifier enable output pulse 1538, 1540 causes the sense amplifiers (not shown) to begin sensing the coupled bitlines of the first and second data word sets, respectively. In FIG. 15A, the latency timeout signal one shot signal 1506 and address valid latch one shot signal 1504 are coupled to a 2-input NOR gate through transmission gates 1526 and 1524, respectively, of the input control circuit 1502. The output of the 2-input NOR gate 1520 of the input circuit 1502 is coupled through an inverter 1522 to place a logical one on an input of a 2-input NAND gate 1508 and the input of an inverting capacitive delay line 1546. The inverting capacitive delay line 1546 contains a series of coupled inverters 1510 and capacitive loads 1512, and produces a selected signal delay. The output of the capacitive delay line 1546 is coupled to the remaining input of the 2-input NAND gate 1508. The logical one output of the NOR gate 1520 and the initial logical one output of the capacitive delay chain 1546 produce a logical zero output on the NAND gate 1508. This logical zero output is coupled through an inverter 1514 to produce the sense amplifier enable signal 1530, 1536. The output of the NAND gate 1508 and the output inverter 1514 are coupled back 1516, 1518 to disable the input transmission gates 1524 and 1526. Additionally, the output of the NAND gate 1508 is coupled to pull up PMOS transistors 1528, which pull the inputs of the 2-input NOR gate up to a logical one and latch the input state of the sense amplifier enable circuit 1500 to active. When the logical one placed on the input of the inverting capacitive delay chain 1546 propagates through, a logical zero is placed on the input of the NAND gate 1508. This changes the output of the NAND gate 1508 to a logical one, ending the sense amplifier enable pulse 1538, 1540 and unlocks the input circuit 1502.

In FIGS. 16A and 16B, a sense amplifier enable one shot circuit 1600 and its waveforms 1650 of an embodiment of the present invention are detailed. The sense amplifier enable one shot circuit 1600 produces a sense amplifier enable one shot pulse 1602 after the first sense amplifier enable pulse 1604 and the beginning of sensing of the first data word set. In FIG. 16A, the sense amplifier enable signal 1608 and latency timeout signal 1610 are coupled to 2 inputs of a 3-input NOR gate 1620. The sense amplifier enable signal 1608 is also coupled to an inverting capacitive delay chain 1606 having inverters 1616 and a capacitive load 1618. The output of the capacitive delay chain 1606 is coupled to the remaining input of the 3-input NOR gate 1620. While the latency timeout signal 1610 is logical zero/low, the NOR gate 1620 will produce a short output pulse 1602 through the series coupled inverters 1622 and 1624. This short output pulse 1602 is produced when the sense amplifier enable 1608 signal returns to logical zero/low 1604. The short output pulse 1602 is equal to the propagation delay of the capacitive delay chain 1606, and ends when the sense amplifier signal transition 1604 propagates through the capacitive delay circuit 1606 to place a logical one on its input of the NOR gate 1620. While the latency timeout signal 1610 is logical one/high 1614, the NOR gate 1620 will not respond to transitions on the sense amplifier enable signal line 1608.

Figure 17A:
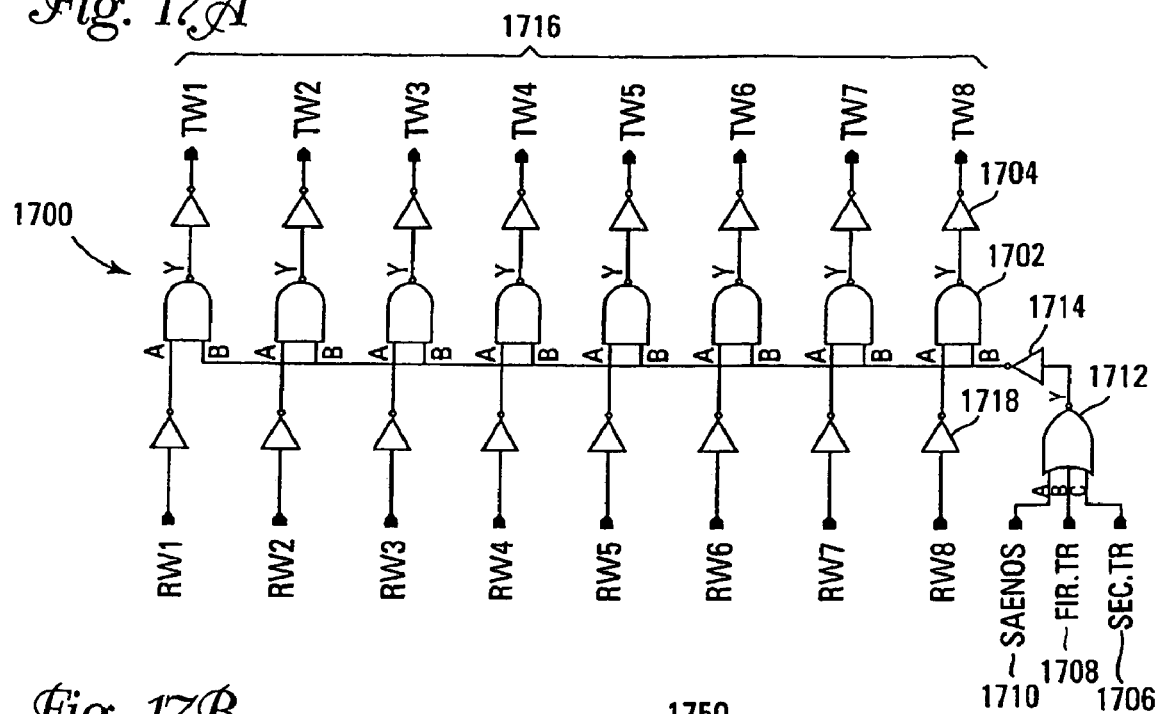
FIGS. 17A and 17B are diagrams of a sense amplifier to intermediate latch transfer circuit and its signal waveforms of a memory in accordance with an embodiment of the present invention.
Figure 17B:
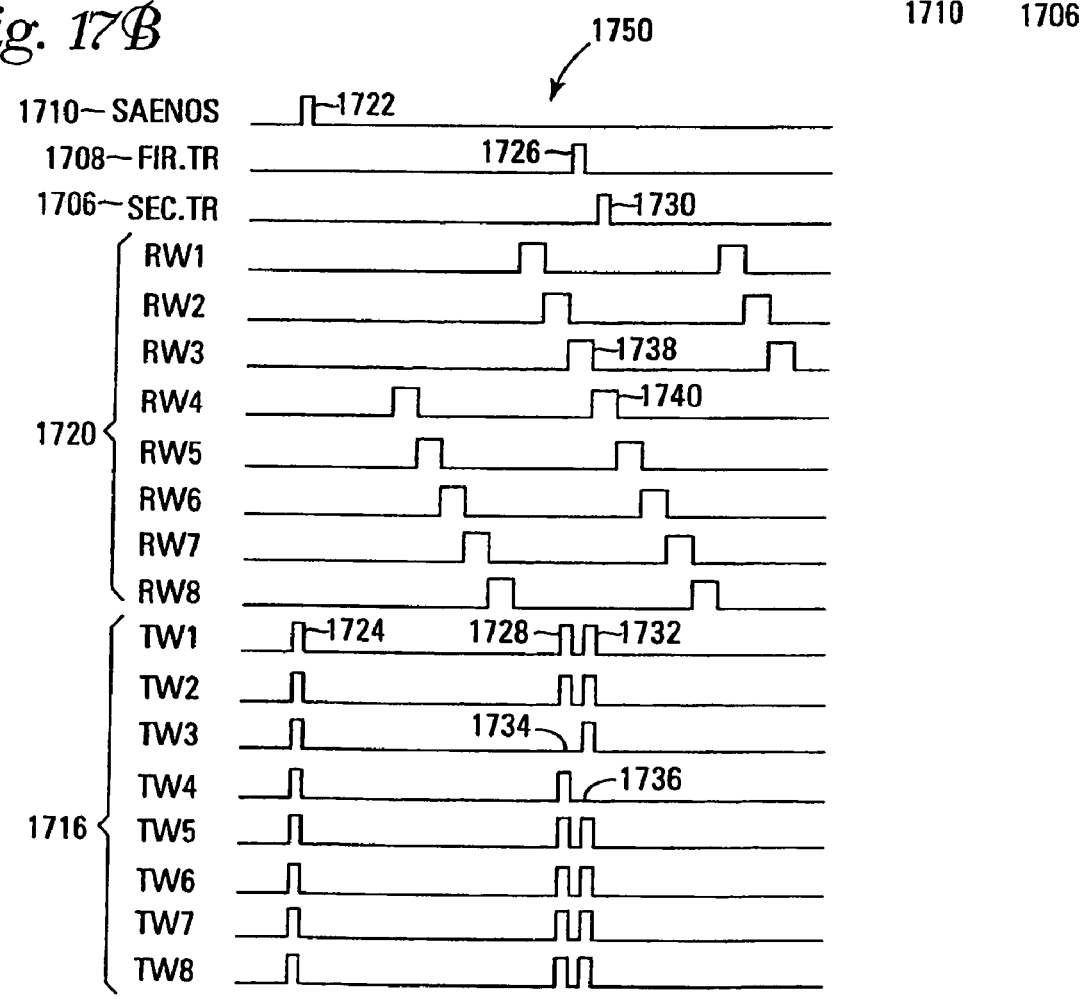

In FIGS. 17A and 17B, an intermediate latch control circuit 1700 and its waveforms 1750 of an embodiment of the present invention are detailed. In FIG. 17A, a sequence of 8 intermediate latch data word group trigger signals/clocks 1716 are output by 8 2-input NAND gates 1702 coupled through inverters 1704. The 2-input NAND gates are triggered by a 3-input NOR gate 1712 coupled to one of their inputs through an inverter 1714. Three triggering event signals, consisting of the sense amplifier enable one shot signal 1710, the first trigger signal 1708, and second trigger signal 1706, are coupled to the inputs of the 3-input NOR gate 1712 and initiate operation of the intermediate latch control circuit 1700 upon receiving any one of the triggering event signals 1706, 1708, and 1710. The data word currently being read is coupled to the intermediate latch control circuit 1700 by 8 read data word select signals 1720. The 8 read word select signals 1720 are each coupled to a single corresponding input of 8 2-input NAND gates 1702 through inverters 1718. The 8 read word select signals disable the trigger signal/clock to the corresponding intermediate data latch if its data is currently being read from the memory.

FIG. 17B shows the waveforms of an example of operation of the intermediate latch control circuit 1700 of FIG. 17A, including a stutter access to avoid gaps/wait states in the data burst. In FIG. 17B, a sense amplifier enable one shot signal 1722 initiates a triggering/clocking of the intermediate latches 1724 after the first set of data word of a column page have been sensed. Because no data word is being accessed for reading, all of the intermediate data latches are clocked. A first trigger signal 1726 initiates a triggering/clocking 1728 of 7 of the 8 groups of intermediate latches after the first 7 data words have been read from the memory. All intermediate data latches except the data latches of data word 3 1734, which is being selected for reading by RW3 1738, are clocked. A second trigger signal 1730 one clock later initiates triggering/clocking 1732 of 7 of the 8 groups of intermediate latches again. All intermediate data latches except the data latches of data word 4 1736, which is selected for reading by RW4 1740, are clocked, finishing the filling of the intermediate latches with data from the second data set of the column page started by the first trigger 1726.

It is noted that burst read operations with other embodiments of the present invention are possible and should be apparent to those skilled in the art with the benefit of the present invention.

CONCLUSION

Memory device has been described that utilizes a reduced number of sense amplifiers to sense the data bits of the selected column page. This is accomplished by multiplexing the sense amplifiers and latching the results to allow the sense amplifiers to sense the next set of data lines from the selected column page. The reduced number of sense amplifiers allows for a smaller internal data bus to be utilized, saving additional circuit space and routing resources. The number of sense amplifiers are chosen such that the resulting number of data words they read are equal to or greater than the greatest number of data words that can be read from the memory device in the time of the minimum read latency time/sensing cycle time of the sense amplifiers. This allows the memory to be able to sense the next set of data bit lines and assemble the data words before they are required to be available for reading out of the memory device. A specialized decoder, referred to herein as a domino decoder, and a latch control circuit are utilized to select a set of data bit lines to be sensed and control the data latches. This allows there to be no gaps or latencies while reading data from the memory due to reloading the read latches or in multiplexing the sense amplifiers to sense a following set of data bit lines in the selected column page. Additionally, this allows a burst read starting point to be selected at random from the selected column page.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a memory device comprising:
   receiving an address;
   selecting a column page with the address from a memory array having a plurality of memory cells;
   dividing the colunm page into a plurality of data word sets based on an initial data word offset address, wherein each data word set contains an equal number of one or more data words;
   selecting and sensing an initial data word set of the colunm page, wherein the initial data word set begins with a data word of the initial data word offset address; and
   selecting and sensing a following sequential data word set of the column page while reading the one or more data words of the initial data word set sequentially from the memory device.

2. The method of claim 1, further comprising:
   selecting and sensing any further following sequential data word sets of the column page while reading the one or more data words of a previously sensed data word set sequentially from the memory device until all the data word sets of the selected column page have been read.

3. The method of claim 1, further comprising:
   latching a first data word set in an intermediate latch circuit, wherein the intermediate latch circuit contains a plurality of latch groups, each latch group having a plurality of latch circuits and latching a single data word;
   latching a second data word set in the intermediate latch circuit after all but a final data word of the first data word set has been read from the memory device, such that all latch groups of the intermediate latch circuit except for a first group of latches that is currently selected and contains the final selected data word are clocked; and
   latching only the first group of latches after the final selected data word of the first data word set is read from the memory device to complete latching the second data set.

4. The method of claim 3, wherein latching the first data word set in an intermediate latch circuit further comprises latching the first data word set in an intermediate latch circuit by triggering all of the latches in the intermediate latch circuit.

5. The method of claim 1, further comprising:
   latching a first data word set in an intermediate latch circuit, wherein the intermediate latch circuit contains a plurality of latch groups, each latch group having a plurality of latch circuits and latching a single data word;

latching a second data word set in the intermediate latch circuit after all but a final data word of the first data word set has been read from the memory device, such that all latch groups of the intermediate latch circuit except for a first group of latches that is currently selected and contains the final selected data word are clocked; and latching a final data word of the second data word set in the intermediate latch circuit after the final data word of the first data word set has been read from the memory device, such that all latch groups of the intermediate latch circuit except for a second group of latches that is currently selected and contains a first selected data word of the second data word set are clocked to complete latching the second data word set.

6. The method of claim 1, wherein the memory device is adapted to cross a column or row page boundary after the highest addressed data word in the column page is read.

7. The method of claim 6, wherein the initial data word offset address is reset to zero after crossing a column or row page boundary.

8. The method of claim 1, wherein dividing the column page into a plurality of data word sets based on the initial data word offset address further comprises dividing the column page into a plurality of data word sets based on the initial data word offset address and wrapping around the column page to select data words starting from the lowest addressed data word in the column page after the highest addressed data word in the column page is selected for a data word set.

9. The method of claim 1, wherein the number of data word sets in a column page is two.

10. The method of claim 1, wherein the data words are read from the memory device in a read burst.

11. The method of claim 1, wherein the memory device is a synchronous memory device.

12. A method of operating a non-volatile memory device comprising:

receiving an address;

selecting a column page with the address from a memory array having a plurality of non-volatile memory cells;

dividing the column page into two data word sets based on an initial data word offset address, wherein each data word set contains an equal number of two or more data words;

selecting and sensing a first data word set of the column page, wherein the first data word set contains the initial data word offset address;

latching the first data word set in to an intermediate column latch circuit, wherein the intermediate column latch circuit contains a plurality of latch groups, each latch group having a plurality of latch circuits and latches a single data word;

selecting and sensing a second sequential data word set of the column page while reading the two or more data words of the first data word set sequentially from the non-volatile memory device;

latching the second sequential data word set in the intermediate column latch circuit after all but a final data word of the first data word set has been read from the non-volatile memory device, such that all latch groups of the intermediate column latch circuit except for a first group of latches that is currently selected and contains the final selected data word are clocked; and latching a final data word of the second sequential data word set in the intermediate column latch circuit after the final data word of the first data word set has been read from the non-volatile memory device, such that all latch groups of the intermediate colunm latch circuit except for a second group of latches that is currently selected and contains a first selected data word of the second sequential data word set are clocked to complete latching the second sequential data word set.

13. The method of claim 12, wherein latching the first data word set in an intermediate colunm latch circuit further comprises latching the first data word set in an intermediate column latch circuit by triggering all of the latches in the intermediate column latch circuit.

14. The method of claim 12, wherein the non-volatile memory device is configured to cross a column page boundary or a row page boundary after the highest addressed data word in the column page is read.

15. The method of claim 14, wherein the initial data word offset address is reset to zero after crossing the page boundary.

16. The method of claim 12, wherein dividing the column page into two data word sets based on the initial data word offset address further comprises dividing the column page into two data word sets based on the initial data word offset address and wrapping around the column page to select data words starting from a lowest addressed data word in the column page after the highest addressed data word in the column page is selected for a data word set.

17. A memory device comprising:

a memory array having a plurality of memory cells arranged in rows and columns;

an address circuit, adapted to receive a memory address;

a row decoder coupled to the address circuit and the memory array, wherein the row decoder is adapted to access a selected row page of memory from the memory array;

a column decoder coupled to the address circuit and the memory array, wherein the column decoder is adapted to access a selected column page having a number of bitlines from the memory array;

a decoder circuit coupled to the address circuit, wherein the decoder circuit is adapted to select a set of data words from the selected column page, each data word having a plurality of bitlines;

a multiplexer coupled to the decoder circuit;

a plurality of sense amplifiers, wherein the multiplexer is adapted to selectively couple the plurality of bitlines of each data word of the selected set of data words to the plurality of sense amplifiers, and wherein the number of bitlines of the selected column page is greater than the number of the plurality of sense amplifiers;

an intermediate latch circuit having a plurality of data word latch groups coupled to the sense amplifiers;

an intermediate latch control circuit coupled to the intermediate latch circuit, wherein the intermediate latch control circuit is adapted to clock the intermediate latch circuit to latch in a first set of data words; and wherein the intermediate latch circuit is adapted to latch in a new data word set while a final data word is read from the memory device from a current data word set held in the intermediate data latch circuit in a multiple trigger latching action, such that there are no gaps in reading the final data word of the current data word set and a first data word of the new data word set.

18. The memory device of claim 17, wherein the memory device is adapted to read one or more data words of a first data word set from the intermediate latch circuit while a second set of data word bitlines is sensed by the plurality of sense amplifiers.

19. The memory device of claim 17, wherein the decoder circuit is adapted to select and couple a second set of data words to the plurality of sense amplifiers after a first set of data words have been sensed and latched into the intermediate latch circuit.

20. The memory device of claim 19, wherein the intermediate latch control circuit is adapted to latch the second set of data words into the intermediate latch circuit upon the selection of a final data word of the first set of data words, such that all latches of the intermediate latch circuit except for a first group of latches containing the final data word of the first data word set upon the selection of a final data word of the first set of data words, and clocks all latches of the intermediate latch circuit except for a second group of latches containing a first data word of the second data set, when the first data word of the second data set is selected.

21. The memory device of claim 17, wherein the selected column page contains a plurality of data word sets.

22. The memory device of claim 17, wherein the decoder circuit selects a first and second set of data words from a starting address offset from the selected column page.

23. The memory device of claim 17, wherein the memory device is a synchronous memory.

24. A system, comprising:
a host coupled to a memory device, wherein the memory device comprises,
a memory array having a plurality of memory cells arranged in rows and columns;
an address circuit, adapted to receive a memory address;
a row decoder coupled to the address circuit and the memory array, wherein the row decoder is adapted to access a selected row page of memory from the memory array;
a column decoder coupled to the address circuit and the memory array, wherein the column decoder is adapted to access a selected column page having a number of bitlines from the selected row page of the memory array;
a decoder circuit coupled to the address circuit, wherein the decoder circuit is adapted to select a set of data words from the selected column page, each data word having a plurality of bitlines;
a multiplexer coupled to the decoder circuit;
a plurality of sense amplifiers, wherein the multiplexer is adapted to selectively couple the plurality of bitlines of each data word of the selected set of data words to the plurality of sense amplifiers, and wherein the number of bitlines of the selected colunm page is greater than the number of the plurality of sense amplifiers;
an intermediate latch circuit having a plurality of data word latch groups coupled to the sense amplifiers;

wherein the intermediate latch circuit is adapted to latch in a first set of data words;
wherein the decoder circuit is adapted to select and couple a second set of data words to the plurality of sense amplifiers after the first set of data words have been latched into the intermediate latches; and
wherein the intermediate latch circuit is adapted to latch the second set of sensed data words into the intermediate latch circuit upon the selection of a final data word of the first set of data words, such that all latches of the intermediate latch circuit except for a first group of latches upon the selection of a final data word of the first set of data words are clocked, and all latches of the intermediate latch circuit except for a second group of latches when a first data word of the second data set is selected.

25. The system of claim 24, wherein the host is a processor.

26. The system of claim 24, wherein the host is a computer system.

27. A method of operating a memory device comprising:
receiving an address;
selecting a memory page with the address from a memory array having a plurality of memory cells;
dividing the page into a plurality of data word sets, wherein each data word set contains an equal number of one or more data words;
selecting and sensing an initial data word set of the memory page, wherein the initial data word set begins with an initial data word of the address; and
selecting and sensing a following sequential data word set of the memory page while reading the one or more data words of the initial data word set sequentially from the memory device.

28. The method of claim 27, wherein dividing the page into a plurality of data word sets, wherein each data word set contains an equal number of one or more data words further comprises dividing the page into a plurality of data word sets based on an initial data word offset address.

29. The method of claim 27, further comprising:
selecting and sensing any further following sequential data word sets of the memory page while reading the one or more data words of a previously sensed data word set sequentially from the memory device until all the data word sets of the selected memory page have been read.

30. The method of claim 27, wherein the memory device is adapted to cross a memory page boundary after the highest addressed data word in the selected memory page is read.

* * * * *

UNITED STATES PATENT AND TRADEMARK OFFICE
CERTIFICATE OF CORRECTION

PATENT NO. : 7,240,147 B2  Page 1 of 1
APPLICATION NO. : 11/416583
DATED : July 3, 2007
INVENTOR(S) : Dumitru Cioaca It is certified that error appears in the above-identified patent and that said Letters Patent is hereby corrected as shown below:

Column 24, line 24, replace "colunm" with --column--.
Column 24, line 29, replace "colunm" with --column--.
Column 26, line 5, replace "colunm" with --column--.
Column 26, line 11, replace "colunm" with --column--.
Column 27, line 51, replace "colunm" with --column--.

Signed and Sealed this

Eighth Day of January, 2008

JON W. DUDAS
*Director of the United States Patent and Trademark Office*